United States Patent
Zhao et al.

(10) Patent No.: US 12,130,990 B2
(45) Date of Patent: Oct. 29, 2024

(54) PHOTOELECTRIC DETECTION CIRCUIT, METHOD OF CONTROLLING PHOTOELECTRIC DETECTION CIRCUIT, AND PIXEL UNIT

(71) Applicant: BOE Technology Group Co., Ltd., Beijing (CN)

(72) Inventors: Fangyuan Zhao, Beijing (CN); Jiabin Wang, Beijing (CN); Yue Tong, Beijing (CN); Lei Wang, Beijing (CN); Yangbing Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/795,785

(22) PCT Filed: Sep. 27, 2021

(86) PCT No.: PCT/CN2021/120986
§ 371 (c)(1),
(2) Date: Jul. 27, 2022

(87) PCT Pub. No.: WO2023/044909
PCT Pub. Date: Mar. 30, 2023

(65) Prior Publication Data
US 2024/0184405 A1   Jun. 6, 2024

(51) Int. Cl.
*H01L 27/146* (2006.01)
*G06F 3/042* (2006.01)

(52) U.S. Cl.
CPC ........ *G06F 3/042* (2013.01); *H01L 27/14612* (2013.01); *H01L 27/14643* (2013.01)

(58) Field of Classification Search
None
See application file for complete search history.

(56) References Cited

U.S. PATENT DOCUMENTS

| | | | |
|---|---|---|---|
| 10,592,037 B2* | 3/2020 | Noguchi | G06F 3/0412 |
| 2015/0254491 A1* | 9/2015 | Mo | G06F 3/044 |
| | | | 345/174 |

(Continued)

FOREIGN PATENT DOCUMENTS

| | | | |
|---|---|---|---|
| CN | 108419031 A | 8/2018 | |
| CN | 108646949 A | 10/2018 | |

(Continued)

*Primary Examiner* — Parul H Gupta
(74) *Attorney, Agent, or Firm* — WHDA, LLP

(57) ABSTRACT

A photoelectric detection circuit, a method of controlling the photoelectric detection circuit and a pixel unit are provided. The photoelectric detection circuit includes: a detection sub-circuit configured to generate a current flowing between a bias voltage signal terminal and a input node in response to an optical signal; a storage sub-circuit connected between the bias voltage signal terminal and the input node, and configured to store energy based on the current generated by the detection sub-circuit; an integrator sub-circuit having a first input terminal, a second input terminal and an output terminal, and configured to integrate a signal of the first input terminal based on a potential of the second input terminal to generate an integrated signal and output the integrated signal at the output terminal; and a control sub-circuit connected to a control signal terminal, the input node and the first input terminal of the integrator sub-circuit.

20 Claims, 13 Drawing Sheets

(56) References Cited

U.S. PATENT DOCUMENTS

| | | | | |
|---|---|---|---|---|
| 2021/0209326 A1* | 7/2021 | Cao | .................... | G06V 40/1318 |
| 2021/0357608 A1* | 11/2021 | Tang | ...................... | H10K 59/65 |
| 2022/0173142 A1* | 6/2022 | Shi | ......................... | H04N 25/77 |

FOREIGN PATENT DOCUMENTS

| | | | |
|---|---|---|---|
| CN | 109298804 | A | 2/2019 |
| CN | 111355901 | A | 6/2020 |
| CN | 111404533 | A | 7/2020 |
| CN | 112464826 | A | 3/2021 |
| CN | 112511769 | A | 3/2021 |
| CN | 113053274 | A | 6/2021 |
| JP | 2019-071580 | A | 5/2019 |

\* cited by examiner

PHOTOELECTRIC DETECTION CIRCUIT, METHOD OF CONTROLLING PHOTOELECTRIC DETECTION CIRCUIT, AND PIXEL UNIT

CROSS-REFERENCE TO RELATED APPLICATIONS

The present disclosure is a Section 371 National Stage Application of International Application No. PCT/CN2021/120986, filed on Sep. 27, 2021, entitled "PHOTOELECTRIC DETECTION CIRCUIT, METHOD OF CONTROLLING PHOTOELECTRIC DETECTION CIRCUIT, AND PIXEL UNIT", which is incorporated herein by reference in its entirety.

TECHNICAL FIELD

The present disclosure relates to a field of photoelectric detection technology, and in particular to a photoelectric detection circuit, a method of controlling the photoelectric detection circuit, and a pixel unit.

BACKGROUND

Generally, for optical fingerprint recognition, a photosensitive device may be arranged in an array to collect an intensity change of reflected light or transmitted light due to finger texture, and photoelectric conversion is performed by the photosensitive device. Fingerprint image collection may be achieved according to an electrical signal converted from the light intensity, in order to achieve the optical fingerprint recognition. However, the detection effect of most detection circuits at present is not satisfactory.

SUMMARY

Embodiments of the present disclosure provides a photoelectric detection circuit, the photoelectric detection circuit includes:
  a detection sub-circuit connected to a detection voltage signal terminal, a bias voltage signal terminal and an input node, and configured to generate a current flowing between the bias voltage signal terminal and the input node in response to an optical signal under control of a potential of the detection voltage signal terminal;
  a storage sub-circuit connected between the bias voltage signal terminal and the input node, and configured to store energy based on the current generated by the detection sub-circuit;
  an integrator sub-circuit having a first input terminal, a second input terminal and an output terminal, and configured to integrate a signal of the first input terminal based on a potential of the second input terminal to generate an integrated signal and output the integrated signal at the output terminal; and
  a control sub-circuit connected to a control signal terminal, the input node and the first input terminal of the integrator sub-circuit, and configured to provide a potential of the input node to the first input terminal of the integrator sub-circuit under control of the control signal terminal.

For example, the storage sub-circuit includes a first capacitor, wherein a first electrode of the first capacitor is connected to the bias voltage signal terminal, and a second electrode of the first capacitor is connected to the input node.

For example, the photoelectric detection circuit further includes a reset auxiliary sub-circuit, wherein the detection sub-circuit is connected to the bias voltage signal terminal through the reset auxiliary sub-circuit, and the reset auxiliary sub-circuit is configured to, under control of a reset auxiliary signal terminal, electrically connect the detection sub-circuit to the bias voltage signal terminal during a detection period and electrically isolate the detection sub-circuit from the bias voltage signal terminal during a reset period.

For example, the reset auxiliary sub-circuit includes a first transistor, wherein a gate electrode of the first transistor is connected to the reset auxiliary signal terminal, a first electrode of the first transistor is connected to the bias voltage signal terminal, and a second electrode of the first transistor is connected to the detection sub-circuit.

For example, the photoelectric detection circuit further includes a reset sub-circuit connected to a reset signal terminal, the input node and a reset voltage terminal, and configured to provide a potential of the reset voltage terminal to the input node under control of a signal of the reset signal terminal, wherein the potential of the reset voltage terminal is equal to the potential of the second input terminal of the integrator sub-circuit.

For example, the reset sub-circuit includes a second transistor, wherein a gate electrode of the second transistor is connected to the reset signal terminal, a first electrode of the second transistor is connected to the reset voltage terminal, and a second electrode of the second transistor is connected to the input node.

For example, the photoelectric detection circuit further includes an amplifying sub-circuit connected between the input node and the control sub-circuit and connected to a reference voltage terminal, wherein the amplifying sub-circuit is configured to generate a current flowing between a reference voltage terminal and the control sub-circuit under control of the potential of the input node.

For example, the amplifying sub-circuit includes a third transistor, a gate electrode of the third transistor is connected to the input node, a first electrode of the third transistor is connected to the reference voltage terminal, and a second electrode of the third transistor is connected to the control sub-circuit.

For example, the detection sub-circuit includes a fourth transistor, wherein a gate electrode of the fourth transistor is connected to the detection voltage signal terminal, a first electrode of the fourth transistor is connected to the bias voltage signal terminal, and a second electrode of the fourth transistor is connected to the input node.

For example, the photoelectric detection circuit includes a plurality of detection sub-circuits.

For example, the control sub-circuit includes a fifth transistor, wherein a gate electrode of the fifth transistor is connected to the control signal terminal, a first electrode of the fifth transistor is connected to the input node, and a second electrode of the fifth transistor is connected to the first input terminal of the integrator sub-circuit.

For example, the integrator sub-circuit includes:
  an operational amplifier, wherein a first input terminal of the operational amplifier is connected as the first input terminal of the integrator sub-circuit, a second input terminal of the operational amplifier is connected as the second input terminal of the integrator sub-circuit, and an output terminal of the operational amplifier is connected as the output terminal of the integrator sub-circuit; and
  a second capacitor, wherein a first electrode of the second capacitor is connected to the first input terminal of the operational amplifier, and a second electrode of the second capacitor is connected to the second input terminal of the operational amplifier.

For example, the detection sub-circuit includes a fourth transistor, the control sub-circuit includes a fifth transistor, the fourth transistor and the fifth transistor are disposed on a base substrate, a first electrode of the fourth transistor and a second electrode of the fourth transistor are disposed in the same layer as a first electrode of the fifth transistor and a second electrode of the fifth transistor, an active layer of the fourth transistor is disposed in the same layer as an active layer of the fifth transistor, a gate electrode of the fourth transistor is disposed on a side of the active layer of the fourth transistor facing the base substrate, and a gate electrode of the fifth transistor is disposed on a side of the active layer of the fifth transistor away from the base substrate.

For example, a planarization layer is disposed on a side of the fourth transistor and the fifth transistor away from the base substrate, a first electrode of the first capacitor is located on a side of the planarization layer away from the base substrate, and a second electrode of the first capacitor is located on a side of the planarization layer facing the base substrate.

The embodiments of the present disclosure further provides a pixel unit, including:
  at least one pixel circuit, wherein each pixel circuit is configured to emit light based on a data voltage; and
  the above-mentioned photoelectric detection circuit.

For example, the pixel circuit includes a driving transistor, the driving transistor includes an active layer located on a base substrate, a gate electrode located on a side of the active layer away from the base substrate, a first gate insulating layer located between the active layer and the gate electrode, a second gate insulating layer located on a side of the gate electrode away from the base substrate, an interlayer dielectric layer located on a side of the second gate insulating layer away from the base substrate, and a source electrode and a drain electrode located on a side of the interlayer dielectric layer away from the base substrate; and
  the detection sub-circuit of the photoelectric detection circuit includes a fourth transistor, and the control sub-circuit of the photoelectric detection circuit includes a fifth transistor, wherein a gate electrode of the fourth transistor is located between the first gate insulating layer and the base substrate, a first electrode of the fourth transistor and a second electrode of the fourth transistor are disposed in the same layer as at least one of the source electrode of the driving transistor and the drain electrode of the driving transistor, an active layer of the fourth transistor is disposed in the same layer as the active layer of the driving transistor, a gate electrode of the fifth transistor is located in the same layer as the gate electrode of the driving transistor, a first electrode of the fifth transistor and a second electrode of the fifth transistor are disposed in the same layer as at least one of the source electrode of the driving transistor and the drain electrode of the driving transistor, and an active layer of the fifth transistor is disposed in the same layer as the active layer of the driving transistor.

For example, the pixel circuit further includes a light-emitting unit having an anode, a cathode, and a light-emitting layer located between the anode and the cathode, wherein a planarization layer is disposed on a side of the interlayer dielectric layer away from the base substrate, and the anode is located on a side of the planarization layer away from the base substrate and is connected to the source electrode of the driving transistor or the drain electrode of the driving transistor by passing through the planarization layer; and
  the storage sub-circuit of the photoelectric detection circuit includes a first capacitor, a first electrode of the first capacitor is disposed in the same layer as the anode, and a second electrode of the first capacitor is located on a side of the planarization layer facing the base substrate.

For example, a first passivation layer and a second passivation layer are further disposed between the planarization layer and the interlayer dielectric layer, wherein the second passivation layer is located between the first passivation layer and the planarization layer, the source electrode of the driving transistor and the drain electrode of the driving transistor are located between the first passivation layer and the interlayer dielectric layer, and the second electrode of the first capacitor is located between the second passivation layer and the first passivation layer.

The embodiments of the present disclosure further provides a method of controlling the above-mentioned photoelectric detection circuit, including:
  generating, by the detection sub-circuit, the current flowing between the bias voltage signal terminal and the input node in response to the optical signal;
  storing, by the storage sub-circuit, energy based on the current generated by the detection sub-circuit;
  providing, by the control sub-circuit, the potential of the input node to the first input terminal of the integrator sub-circuit under control of the control signal terminal; and
  integrating, by the integrator sub-circuit, the signal of the first input terminal of the integrator sub-circuit based on the potential of the second input terminal of the integrator sub-circuit to generate the integrated signal and output the integrated signal at the output terminal of the integrator sub-circuit.

For example, the photoelectric detection circuit further includes a reset auxiliary sub-circuit, and the method includes:
  during a detection period, electrically connecting, by the reset auxiliary sub-circuit, the detection sub-circuit to the bias voltage signal terminal under control of a reset auxiliary signal terminal, generating, by the detection sub-circuit, the current flowing between the bias voltage signal terminal and the input node in response to the optical signal, storing, by the storage sub-circuit, energy based on the current generated by the detection sub-circuit, providing, by the control sub-circuit, the potential of the input node to the first input terminal of the integrator sub-circuit under control of the control signal terminal, and integrating, by the integrator sub-circuit, the signal of the first input terminal based on the potential of the second input terminal to generate the integrated signal and output the integrated signal at the output terminal of the integrator sub-circuit; and
  during a reset period, electrically isolating, by the reset auxiliary sub-circuit, the detection sub-circuit from the bias voltage signal terminal under control of the reset auxiliary signal terminal, electrically connecting, by the detection sub-circuit, the bias voltage signal terminal to the input node under control of the potential of the detection voltage signal terminal, and electrically connecting, by the control sub-circuit, the input node to the first input terminal of the integrator sub-circuit under control of the control signal terminal.

For example, the photoelectric detection circuit further includes a reset sub-circuit, and the method includes:

during a detection period, electrically isolating, by the reset sub-circuit, the reset voltage terminal from the input node under control of a reset signal terminal, generating, by the detection sub-circuit, the current flowing between the bias voltage signal terminal and the input node in response to the optical signal, storing, by the storage sub-circuit, energy based on the current generated by the detection sub-circuit, providing, by the control sub-circuit, the potential of the input node to the first input terminal of the integrator sub-circuit under control of the control signal terminal, and integrating, by the integrator sub-circuit, the signal of the first input terminal of the integrator sub-circuit based on the potential of the second input terminal to generate the integrated signal and output the integrated signal at the output terminal of the integrator sub-circuit; and during a reset period, electrically connecting, by the reset sub-circuit, the reset voltage terminal and the input node under control of the reset signal terminal, and electrically isolating, by the control sub-circuit, the input node from the first input terminal of the integrator sub-circuit under control of the control signal terminal.

For example, the photoelectric detection circuit further includes an amplifying sub-circuit, and the method includes:

during a detection period, generating, by the detection sub-circuit, the current flowing between the bias voltage signal terminal and the input node in response to the optical signal under control of the potential of the detection voltage signal terminal, storing, by the storage sub-circuit, energy based on the current generated by the detection sub-circuit, generating, by the amplifying sub-circuit, a current flowing between the reference voltage terminal and the control sub-circuit under control of the potential of the input node, providing, by the control sub-circuit, the current generated by the amplifying sub-circuit to the first input terminal of the integrator sub-circuit under control of the control signal terminal, and integrating, by the integrator sub-circuit, the signal of the first input terminal based on the potential of the second input terminal of the integrator sub-circuit to generate the integrated signal and output the integrated signal at the output terminal of the integrator sub-circuit; and during a reset period, electrically connecting, by the detection sub-circuit, the bias voltage signal terminal to the input node under control of the potential of the detection voltage signal terminal, wherein a potential of the bias voltage signal terminal during the reset period is different from a potential of the bias voltage signal terminal during the detection period.

DETAILED DESCRIPTION OF EMBODIMENTS

Figure 1:
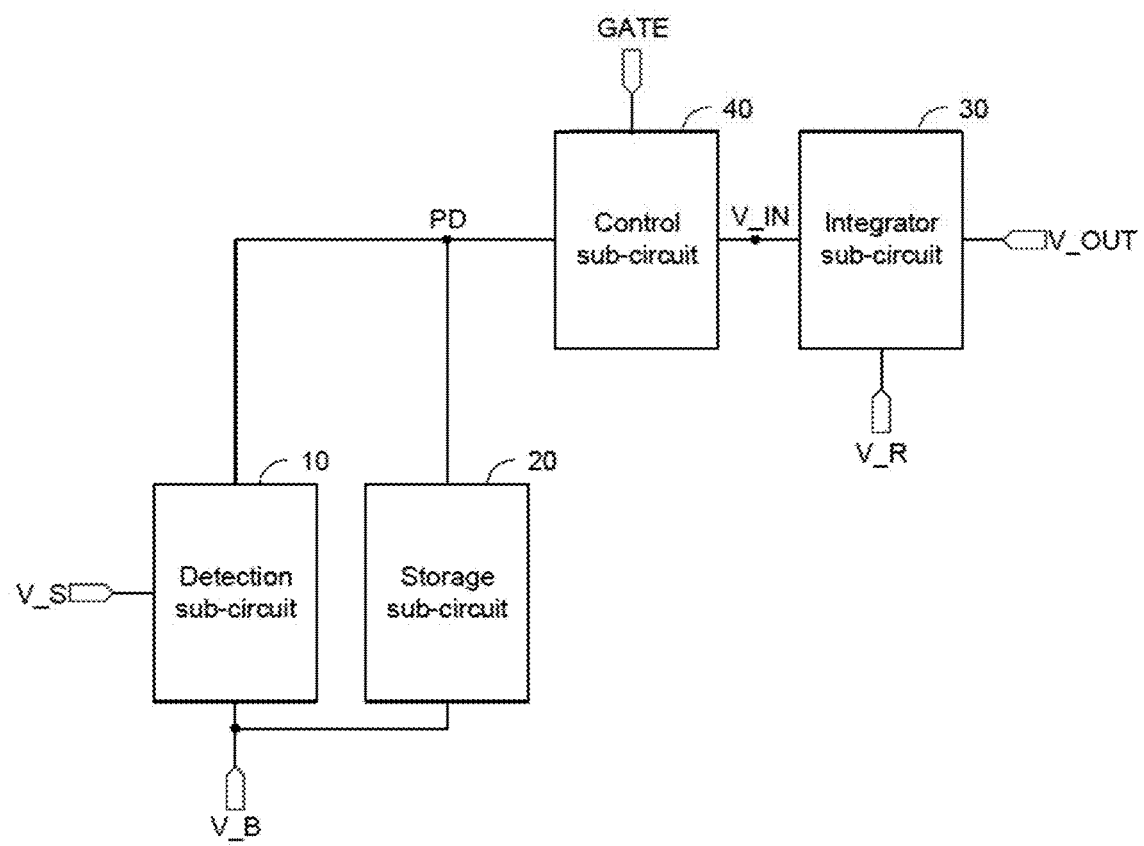
FIG. 1 is a schematic block diagram of a photoelectric detection circuit according to embodiments of the present disclosure.

In order to make the purposes, technical solutions and advantages of the embodiments of the present disclosure clearer, the following will clearly and completely describe the technical solutions in the embodiments of the present disclosure with reference to the accompanying drawings in the embodiments of the present disclosure. Obviously, the described embodiments are some, but not all, of the embodiments of the present disclosure. Based on the described embodiments of the present disclosure, all other embodiments obtained by those of ordinary skill in the art without creative efforts fall within the protection scope of the present disclosure. It should be noted that throughout the drawings, same elements are denoted by the same or similar reference numerals. In the following description, some specific embodiments are only for the purpose of description, and should not be construed as any limitation to the present disclosure. These specific embodiments are merely examples of the embodiments of the present disclosure. Conventional structures or configurations will be omitted when they may lead to obscuring the understanding of the present disclosure. It should be noted that the shapes and sizes of the components in the figures do not reflect actual sizes and proportions, but merely illustrate the contents of the embodiments of the present disclosure.

Unless otherwise defined, technical or scientific terms used in the embodiments of the present disclosure shall have the ordinary meaning as understood by those skilled in the art. "First", "second" and similar words used in the embodiments of the present disclosure do not denote any order, quantity or importance, but are only used to distinguish different components.

In addition, in the description of the embodiments of the present disclosure, the term "connected with" or "connected to" may mean that two components are directly connected, or may mean that two components are connected via one or more other components. Furthermore, the two components may be connected or coupled by wire or wirelessly.

Terminal devices, such as a smart phone, a laptop computer, etc., may provide a user with a fingerprint recognition function to identify the user. In the related art, for optical fingerprint recognition, a photosensitive device may be arranged in an array to collect reflected or transmitted light signals under different finger regions. The photosensitive device is then used for photoelectric conversion to convert the light signal into an electrical signal. Finally, an analog-to-digital converter (ADC) is used to convert the electrical signal into a digital signal to complete the fingerprint image acquisition.

Generally PIN photodiodes are used to produce in-screen (under-screen) fingerprint recognition components. The PIN photodiode has a similar structure to a semiconductor diode. A die of the PIN photodiode is a PN junction with photosensitive features and has unidirectional conductivity. Therefore, in a working state, a reverse voltage may be provided for the PIN-type photodiode. When no light is provided to the PIN photodiode, the saturated reverse leakage current, that is, the dark current, is small and the photodiode is turned off at this time. When the PIN photodiode is exposed to light, the saturated reverse leakage current increases greatly to form a photocurrent. The photocurrent varies with the intensity of incident light. When light illuminates the PN junction, an electron-hole pair may be generated in the PN junction, which increases the density of minority carriers. These carriers drift under the reverse voltage, to increase the photocurrent (a reverse current). Therefore, the light intensity may be used to change the current in a circuit.

A thin film transistor (TFT) may be used as a switch to control a derivation of charges in the PIN photodiode. Under an ideal condition, no current flows when the TFT is turned off. However, since there are two PN junctions between a drain electrode/a source electrode and a substrate, there is still a reverse saturation current (a leakage current) between the drain electrode and the source electrode even if the TFT has no channel. When the TFT is exposed to light, its output current will also be changed with the intensity of the light. In other words, the TFT may respond to light as a photosensitive device.

As the photosensitive device, the TFT may save cost and reduce the number of masks required in a fabrication process compared to the PIN photodiode. However, when the TFT is used as the photosensitive device, the storage of electric charges is not achieved.

FIG. 1 is a schematic block diagram of a photoelectric detection circuit according to an embodiment of the present disclosure.

As shown in FIG. 1, a photoelectric detection circuit 100 includes a detection sub-circuit 10, a storage sub-circuit 20, an integrator sub-circuit 30 and a control sub-circuit 40.

The detection sub-circuit 10 is connected to a detection voltage signal terminal V_S, a bias voltage signal terminal V_B and an input node PD. The detection sub-circuit 10 may generate a current flowing between the bias voltage signal terminal V_B and the input node PD in response to an optical signal under control of a potential of the detection voltage signal terminal V_S.

The storage sub-circuit 20 is connected between the bias voltage signal terminal V_B and the input node PD. The storage sub-circuit 20 may store energy based on the current generated by the detection sub-circuit 10. For example, the storage sub-circuit 20 may include a first capacitor. A first electrode of the first capacitor is connected to the bias voltage signal terminal V_B. A second electrode of the first capacitor is connected to the input node PD.

The integrator sub-circuit 30 has a first input terminal V_IN, a second input terminal V_R and an output terminal V_OUT. The integrator sub-circuit 30 may integrate a signal of the first input terminal V_IN based on a potential of the second input terminal V_R to generate an integrated signal and output it at the output terminal V_OUT.

The control sub-circuit 40 is connected to a control signal terminal GATE, the input node PD and the first input terminal V_IN of the integrator sub-circuit 30. The control sub-circuit 40 may provide a potential of the input node PD to the first input terminal V_IN of the integrator sub-circuit 30 under control of the control signal terminal GATE.

According to the embodiments of the present disclosure, by providing the above-mentioned energy storage sub-circuit, energy may be stored based on the current generated by the detection sub-circuit, thereby improving the detection accuracy.

Some examples of output circuits of the embodiments of the present disclosure will be described below with reference to FIG. 2 to FIG. 7.

Figure 2:
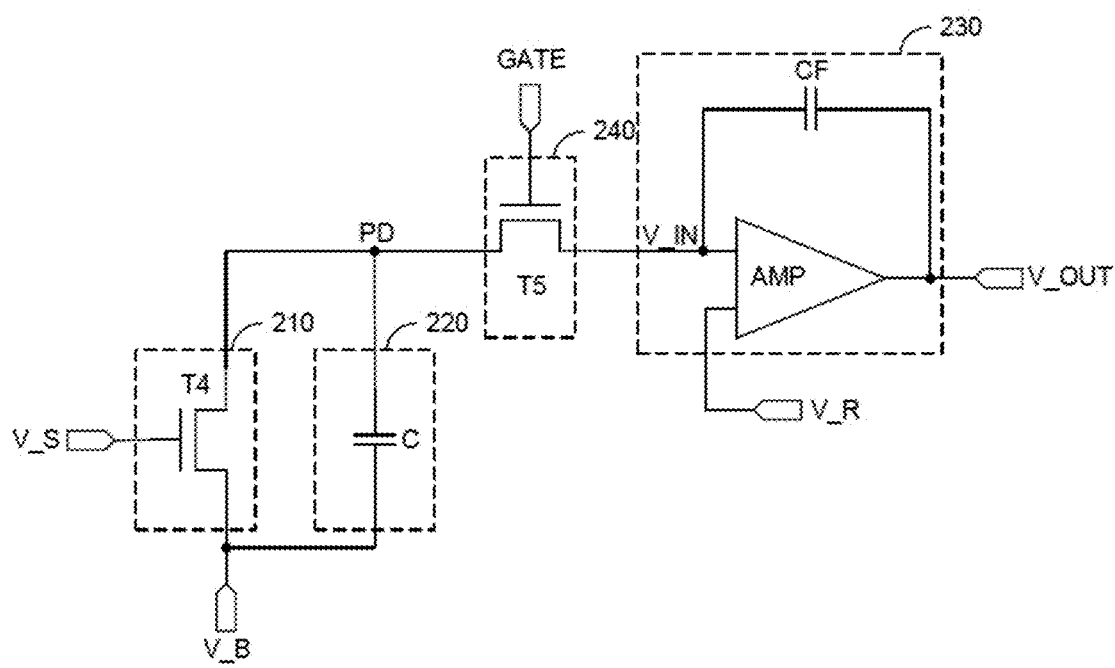
FIG. 2 is a circuit diagram of a photoelectric detection circuit according to an embodiment of the present disclosure.

FIG. 2 is a circuit diagram of a photoelectric detection circuit according to an embodiment of the present disclosure.

As shown in FIG. 2, a photoelectric detection circuit 200 includes a detection sub-circuit 210, a storage sub-circuit 220, an integrator sub-circuit 230 and a control sub-circuit 240. The above descriptions about the detection sub-circuit 10, the storage sub-circuit 20, the integrator sub-circuit 30 and the control sub-circuit 40 are also applicable to this embodiment.

In some embodiments, the detection sub-circuit 210 may include a fourth transistor T4. A gate electrode of the fourth transistor T4 is connected to the detection voltage signal terminal V_S. A first electrode of the fourth transistor T4 is connected to the bias voltage signal terminal V_B. A second electrode of the fourth transistor T4 is connected to the input node PD. The fourth transistor T4 is configured to generate the current flowing between the bias voltage signal terminal V_B and the input node PD in response to the optical signal under control of the potential of the detection voltage signal terminal V_S.

In some embodiments, the storage sub-circuit 220 may include a first capacitor C. A first electrode of the first capacitor C is connected to the bias voltage signal terminal V_B. A second electrode of the first capacitor C is connected to the input node PD. The first capacitor C is configured to store energy based on the current generated by the detection sub-circuit 210.

In some embodiments, the integrator sub-circuit 230 includes an operational amplifier AMP and a second capacitor CF. A first input terminal of the operational amplifier AMP is connected as the first input terminal V_IN of the integrator sub-circuit 230. A second input terminal of the operational amplifier AMP is connected as the second input terminal V_R of the integrator sub-circuit 230. An output terminal of the operational amplifier AMP is connected as the output terminal V_OUT of the integrator sub-circuit 230. A first electrode of the second capacitor CF is connected to the first input terminal of the operational amplifier. A second electrode of the second capacitor CF is connected to the second input terminal of the operational amplifier AMP.

In some embodiments, the control sub-circuit 240 includes a fifth transistor T5. A gate electrode of the fifth transistor T5 is connected to the control signal terminal GATE. A first electrode of the fifth transistor T5 is connected to the input node PD. A second electrode of the fifth transistor T5 is connected to the first input terminal V_IN of the integrator sub-circuit 30. The fifth transistor T5 may be turned on or off under control of the control signal terminal GATE. When the fifth transistor T5 is turned on, the input node PD is electrically connected to the first input terminal V_IN, so that the potential of the input node PD may be provided to the first input terminal V_IN of the integrator sub-circuit 30. When the fifth transistor T5 is turned off, the input node PD is electrically isolated from the first input terminal V_IN, thereby preventing the potential of the input node PD from affecting an output signal of the output terminal V_OUT.

Figure 3:
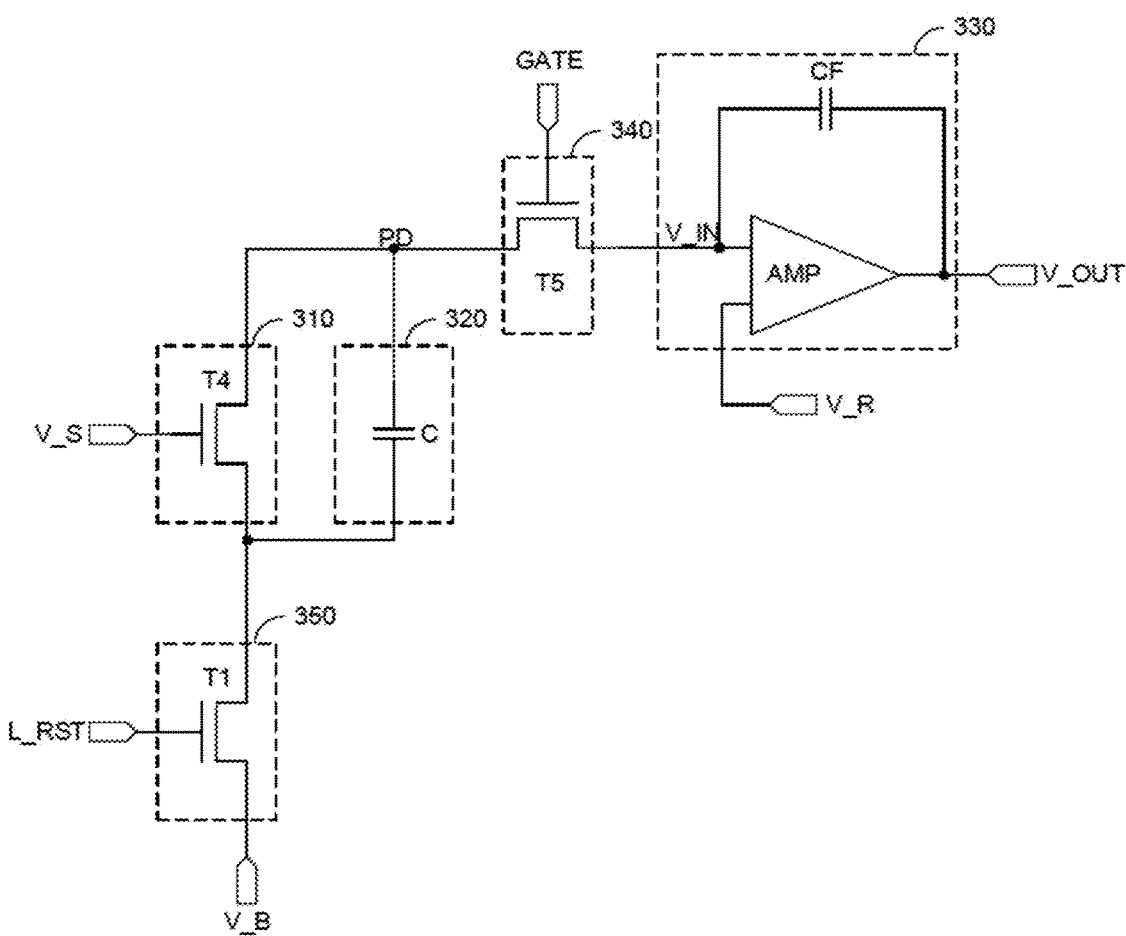
FIG. 3 is a circuit diagram of a photoelectric detection circuit according to another embodiment of the present disclosure.

FIG. 3 is a circuit diagram of a photoelectric detection circuit according to another embodiment of the present disclosure.

As shown in FIG. 3, a photoelectric detection circuit 300 includes a detection sub-circuit 310, a storage sub-circuit 320, an integrator sub-circuit 330 and a control sub-circuit 340. The above description of the detection sub-circuit 210, the storage sub-circuit 220, the integrator sub-circuit 230 and the control sub-circuit 240 is also applicable to the detection sub-circuit 310, the storage sub-circuit 320, the integrator sub-circuit 330 and the control sub-circuit 340, which will not be repeated here.

As shown in FIG. 3, the photoelectric detection circuit 300 may further include a reset auxiliary sub-circuit 350.

The detection sub-circuit 310 is connected to the bias voltage signal terminal V_B through the reset auxiliary sub-circuit 350. The reset auxiliary sub-circuit 350 may, under control of a reset auxiliary signal terminal L_RST, electrically connect the detection sub-circuit 310 to the bias voltage signal terminal V_B during a detection period and electrically isolate the detection sub-circuit 310 from the bias voltage signal terminal V_B during a reset period.

For example, the reset auxiliary sub-circuit 350 may include a first transistor T1. A gate electrode of the first transistor T1 is connected to the reset auxiliary signal terminal L_RST. A first electrode of the first transistor T1 is connected to the bias voltage signal terminal V_B. A second electrode of the first transistor T1 is connected to the detection sub-circuit 310, e.g., connected to the first electrode of the fourth transistor T4.

During a detection process, charges generated by the fourth transistor T4 are stored by the first capacitor C. A signal at the output terminal V_OUT may be read by a back-end reading circuit, during which the charges are derived from the first capacitor C to a capacitor in the back-end reading circuit. When the light intensity is high or the time for deriving the charges is not enough, some of the charges will be accumulated on the C if the charges on the first capacitor C are not fully derived. Then, the charges left in the previous frame will be read out together in the next reading, so that the read signal has a lag.

With the reset auxiliary sub-circuit 350 provided between the bias voltage signal terminal V_B and the detection sub-circuit 310, a reset of the input node PD may be achieved, thereby reducing a leakage current of the detection sub-circuit 310.

For example, in a detection phase, the first transistor T1 of the reset auxiliary sub-circuit 350 is turned on under control of the reset auxiliary signal terminal L_RST, so as to provide a bias voltage of the bias voltage signal terminal V_B to the detection sub-circuit 310 for photoelectric detection.

A reset phase is entered after the data reading of the output terminal V_OUT is completed, that is, after the discharge of the first capacitor C is completed. The first transistor T1 of the reset auxiliary sub-circuit 350 is turned off under control of the reset auxiliary signal terminal L_RST, so that the fourth transistor T4 and the fifth transistor T5 are electrically isolated from the bias voltage signal terminal V_B. In the reset phase, both the fourth transistor T4 and the fifth transistor T5 are turned on, thereby resetting the potential of the input node PD to the voltage of the second input terminal V_R. A width-to-length ratio of the first transistor T1 may be set to be smaller than that of the fourth transistor T4. In this way, although there is a voltage difference between the first electrode and the second electrode of the first transistor T1, the leakage current generated by it is small and thus has a small affection to a potential at the first electrode of the first transistor T1. There is no voltage difference between the first electrode and the second electrode of the fourth transistor T4 of the detection sub-circuit 310, so that the leakage current may not be formed, thereby reducing the hag.

Figure 4:
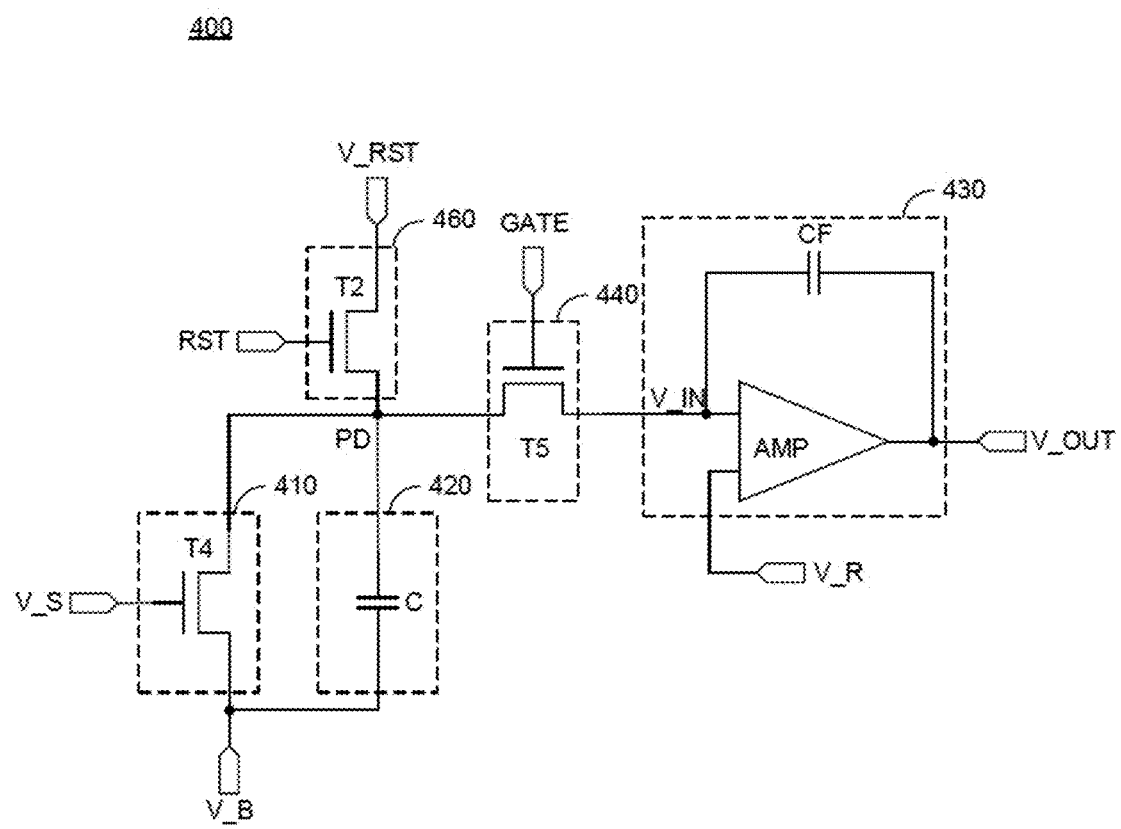
FIG. 4 is a circuit diagram of a photoelectric detection circuit according to another embodiment of the present disclosure.

FIG. 4 is a circuit diagram of a photoelectric detection circuit according to another embodiment of the present disclosure.

As shown in FIG. 4, a photoelectric detection circuit 400 includes a detection sub-circuit 410, a storage sub-circuit 420, an integrator sub-circuit 430 and a control sub-circuit 440. The above description of the detection sub-circuit 210, the storage sub-circuit 220, the integrator sub-circuit 230 and the control sub-circuit 240 is also applicable to the detection sub-circuit 410, the storage sub-circuit 420, the integrator sub-circuit 430 and the control sub-circuit 440, which will not be repeated here.

As shown in FIG. 4, the photoelectric detection circuit 400 may further include a reset sub-circuit 460.

The reset sub-circuit 460 may be connected to a reset signal terminal RST, the input node PD and the reset voltage terminal V_RST. The reset sub-circuit 460 may provide a potential of the reset voltage terminal V_RST to the input node PD under control of a signal of the reset signal terminal RST, wherein the potential of the reset voltage terminal V_RST is equal to the potential of the second input terminal V_R of the integrator sub-circuit 430.

For example, the reset sub-circuit 460 may include a second transistor T2. A gate electrode of the second transistor T2 is connected to the reset signal terminal RST. A first electrode of the second transistor T2 is connected to the reset voltage terminal V_RST. A second electrode of the second transistor T2 is connected to the input node PD.

With the reset sub-circuit 460, the potential of the reset voltage terminal V_RST may be provided to the input node PD after the data reading is completed, thereby removing the charges on the first capacitor C.

In some embodiments, the photoelectric detection circuit 400 may further include the above-mentioned reset auxiliary sub-circuit 350 to further reduce the hag.

Figure 5:
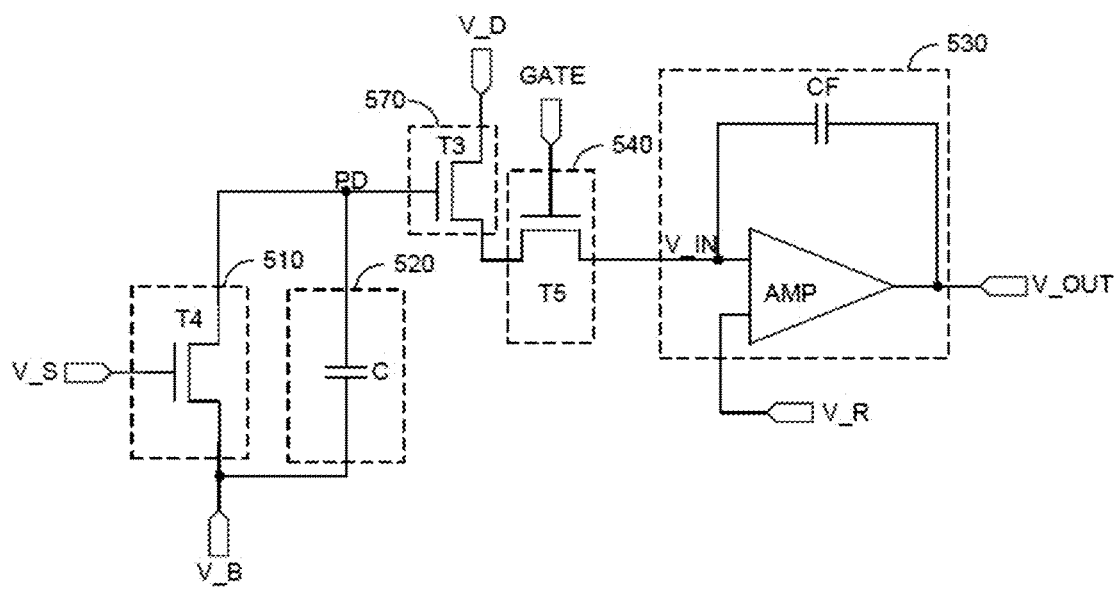
FIG. 5 is a circuit diagram of a photoelectric detection circuit according to another embodiment of the present disclosure.

FIG. 5 is a circuit diagram of a photoelectric detection circuit according to another embodiment of the present disclosure.

As shown in FIG. 5, a photoelectric detection circuit 500 includes a detection sub-circuit 510, a storage sub-circuit 520, an integrator sub-circuit 530 and a control sub-circuit 540. The above description of the detection sub-circuit 210, the storage sub-circuit 220, the integrator sub-circuit 230 and the control sub-circuit 240 is also applicable to the detection sub-circuit 510, the storage sub-circuit 520, the integrator sub-circuit 530 and the control sub-circuit 540, which will not be repeated here.

As shown in FIG. 5, the photoelectric detection circuit 500 may further include an amplifying sub-circuit 570.

The amplifying sub-circuit 570 is connected between the input node PD and the control sub-circuit 540, and is connected to a reference voltage terminal V_D. The amplifying sub-circuit 570 may generate a current Ids flowing between the reference voltage terminal V_D and the control sub-circuit 540 under control of the potential of the input node PD.

For example, the amplifying sub-circuit 570 may include a third transistor T3. A gate electrode of the third transistor T3 is connected to the input node PD. A first electrode of the third transistor T3 is connected to the reference voltage terminal V_D. A second electrode of the third transistor T3 is connected to the control sub-circuit 540. For example, the second electrode of the third transistor T3 is connected to the first electrode of the fifth transistor T5 in the control sub-circuit 540.

With the amplifying sub-circuit 570, current generated by the detection sub-circuit 510 may be amplified, e.g. by 5-20 times. A current at the first input terminal V_IN of the integrator sub-circuit 530 is amplified to reduce a proportion of a noise signal, thereby reducing the noise. In addition, with the amplifying sub-circuit 570, it is also possible to achieve the reset of the input node PD. For example, in the reset phase, a low level may be applied to the detection voltage signal terminal V_S and the bias voltage signal terminal V_B may be switched from a bias voltage (e.g. −4V) to a reference voltage (e.g. 1.4V), so that the fourth transistor T4 is turned on and the reference voltage is provided to the input node PD, thereby completing the reset of the input node PD. In some embodiments, a reset circuit (e.g., the reset circuit 460 described above) may be added to the photoelectric detection circuit 500 to achieve the reset of the input node PD. In this case, the voltage of the bias voltage signal terminal V_B may not be changed in the reset phase. In this way, the anti-interference ability of the output signal may be improved.

Figure 6:
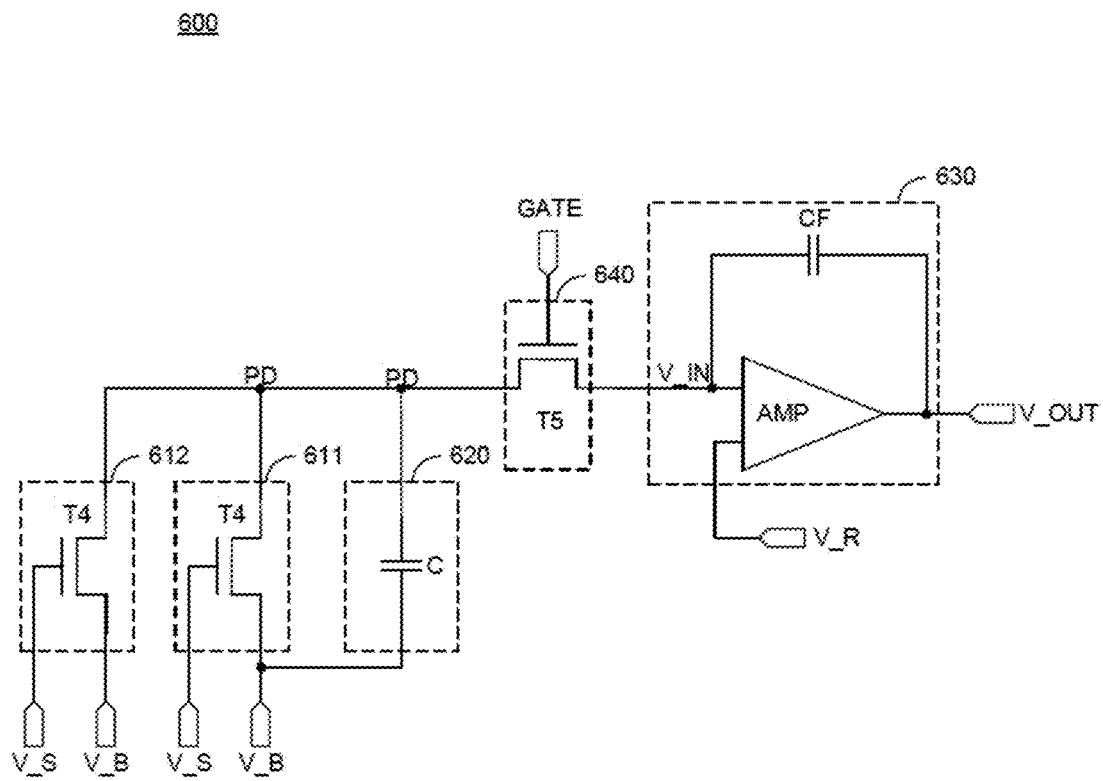
FIG. 6 is a circuit diagram of a photoelectric detection circuit according to another embodiment of the present disclosure.

FIG. 6 is a circuit diagram of a photoelectric detection circuit according to another embodiment of the present disclosure.

As shown in FIG. 6, a photoelectric detection circuit 600 includes a detection sub-circuit 610, a storage sub-circuit 620, an integrator sub-circuit 630 and a control sub-circuit 640. The above description of the detection sub-circuit 210, the storage sub-circuit 220, the integrator sub-circuit 230 and the control sub-circuit 240 is also applicable to the detection sub-circuit 610, the storage sub-circuit 620, the integrator sub-circuit 630 and the control sub-circuit 640, which will not be repeated here.

As shown in FIG. 6, the photoelectric detection circuit 600 may further include a plurality of detection sub-circuits, such as a detection sub-circuit 611 and a detection sub-circuit 612. The above description of the detection sub-circuit 210 is also applicable to any of the detection sub-circuit 611 or the detection sub-circuit 612.

In some embodiments, the detection sub-circuit 611 includes a fourth transistor T4. A gate electrode of the fourth transistor T4 of the detection sub-circuit 611 is connected to the detection voltage signal terminal V_S. A first electrode of the fourth transistor T4 of the detection sub-circuit 611 is connected to the bias voltage signal terminal V_B. A second electrode of the fourth transistor T4 of the detection sub-circuit 611 is connected to the input node PD.

The detection sub-circuit 612 also includes a fourth transistor T4. A second electrode of the fourth transistor T4 of the detection sub-circuit 612 is also connected to the input node PD.

It should be understood that the number of detection sub-circuits in FIG. 6 is only an example. The number of detection sub-circuits in the present disclosure may be set as desired, to provide more detection sub-circuits.

In the embodiments of the present disclosure, a plurality of detection sub-circuits are provided thereby increasing the photocurrent.

Although the photoelectric detection circuit is described above with a specific example, the embodiments of the present disclosure are not limited thereto. The above-described embodiments may be combined in any suitable manner as required to form a new photoelectric detection circuit structure. For example, the above-mentioned photoelectric detection circuit 200 may further include one or more of the above-mentioned reset auxiliary sub-circuit 350, the reset sub-circuit 460 and the amplifying sub-circuit 570. The number of the detection sub-circuits 220 in the photoelectric detection circuit 200 may be expanded in a manner shown in the FIG. 6, such as increased to two, three or more.

In the above embodiments, each transistor in the detection circuit, such as the first transistor, the second transistor, the third transistor, the fourth transistor and the fifth transistor are all P-type transistors, such as P-type TFTs. However, the embodiments of the present disclosure are not limited thereto. Each transistor may be an N-type transistor.

Figure 7:
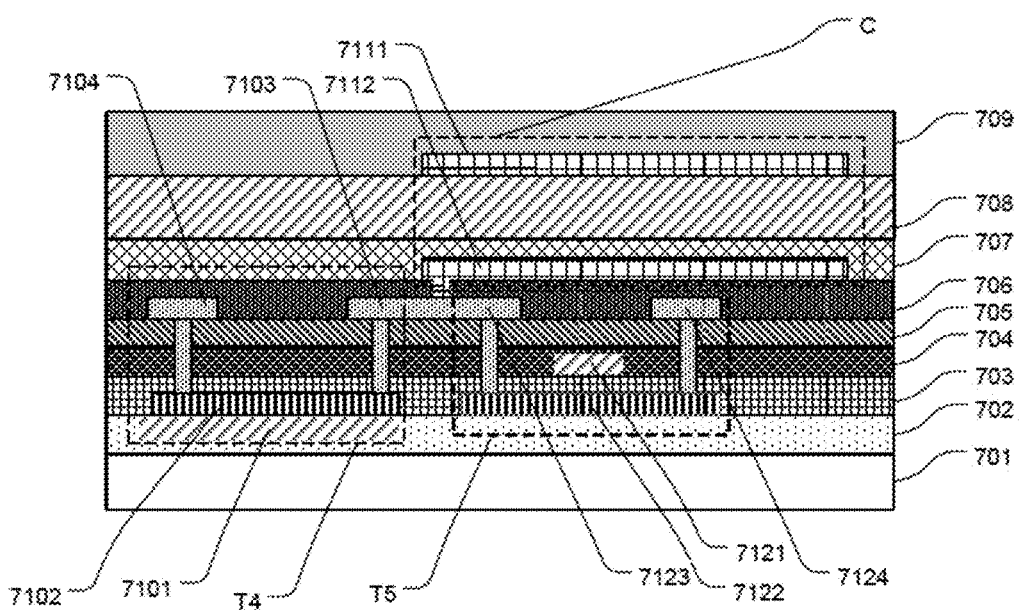
FIG. 7 is a cross-sectional view of a photoelectric detection circuit according to an embodiment of the present disclosure.

FIG. 7 is a cross-sectional view of a photoelectric detection circuit according to an embodiment of the present disclosure. For the convenience of description, only the fourth transistor T4, the fifth transistor T5 and the first capacitor C in the above-mentioned photoelectric detection circuit are shown.

As shown in FIG. 7, in the photoelectric detection circuit such as that shown in FIG. 2, the detection sub-circuit may include the fourth transistor T4, and the control sub-circuit may include the fifth transistor T5. The fourth transistor T4 and the fifth transistor T5 may be disposed on a base substrate 701. A first electrode 7104 and a second electrode 7103 of the fourth transistor T4 are disposed in the same layer as a first electrode 7123 and a second electrode 7124 of the fifth transistor T5. The second electrode 7103 of the fourth transistor T4 is electrically connected to the first electrode 7123 of the fifth transistor T5. An active layer 7102 of the fourth transistor T4 is disposed in the same layer as an active layer 7122 of the fifth transistor T5. A gate electrode 7101 of the fourth transistor T4 is disposed on a side of the active layer 7102 of the fourth transistor T4 facing the base substrate 701. A gate electrode 7121 of the fifth transistor T5 is disposed on a side of the active layer 7122 of the fifth transistor T5 away from the base substrate 701.

A planarization layer 708 is disposed on a side of the fourth transistor T4 and the fifth transistor T5 away from the base substrate 701. A first electrode 7111 of the first capacitor C is located on a side of the planarization layer 708 away from the base substrate 701. A second electrode 7112 of the first capacitor C is located on a side of the planarization layer 708 facing the base substrate 701.

In some embodiments, a first gate insulating layer 703 and a second gate insulating layer 704 are further disposed on the base substrate 701. The active layer 7102 of the fourth transistor T4 and the active layer 7122 of the fifth transistor T5 are both located between the first gate insulating layer 703 and the base substrate 701. The gate electrode 7101 of the fourth transistor T4 is disposed on a side of the first gate insulating layer 703 facing the base substrate 701. The gate electrode 7121 of the fifth transistor T5 is disposed between the first gate insulating layer 703 and the second gate insulating layer 704.

In some embodiments, an interlayer dielectric layer 705 may be further disposed on a side of the second gate insulating layer 704 away from the base substrate 701. The first electrode 7104 and the second electrode 7103 of the fourth transistor T4 and the first electrode 7123 and the second electrode 7124 of the fifth transistor T5 may be all located on a side of the interlayer dielectric layer 705 away from the base substrate 701. The first electrode 7104 and the second electrode 7103 of the fourth transistor T4 are in contact with the active layer 7101 through via holes in the interlayer dielectric layer 705, the second gate insulating layer 704 and the first gate insulating layer 703. The first electrode 7123 and the second electrode 7124 of the fifth transistor T5 are in contact with the active layer 7122 through the via holes in the interlayer dielectric layer 705, the second gate insulating layer 704 and the first gate insulating layer 703.

In some embodiments, a first passivation layer 706 and a second passivation layer 707 may further be disposed between the interlayer dielectric layer 705 and the planarization layer 708. The second passivation layer 707 is located between the first passivation layer 706 and the planarization layer 708. The second electrode 7112 of the first capacitor C is located between the second passivation layer 707 and the first passivation layer 706. In some embodiments, an encapsulation layer 709 may further be disposed on the side of the planarization layer 708 away from the base substrate 701. The first electrode 7111 of the first capacitor C may be located between the encapsulation layer 709 and the planarization layer 708. In some embodiments, the second electrode 7112 of the first capacitor C is respectively in contact with the first electrode 7103 of the fourth transistor T4 and the second electrode 7123 of the fifth transistor T5 through a via hole in the first passivation layer 706.

In some embodiments, a barrier layer 702 may further be disposed between the base substrate 701 and the first gate insulating layer 702.

Figure 8A:
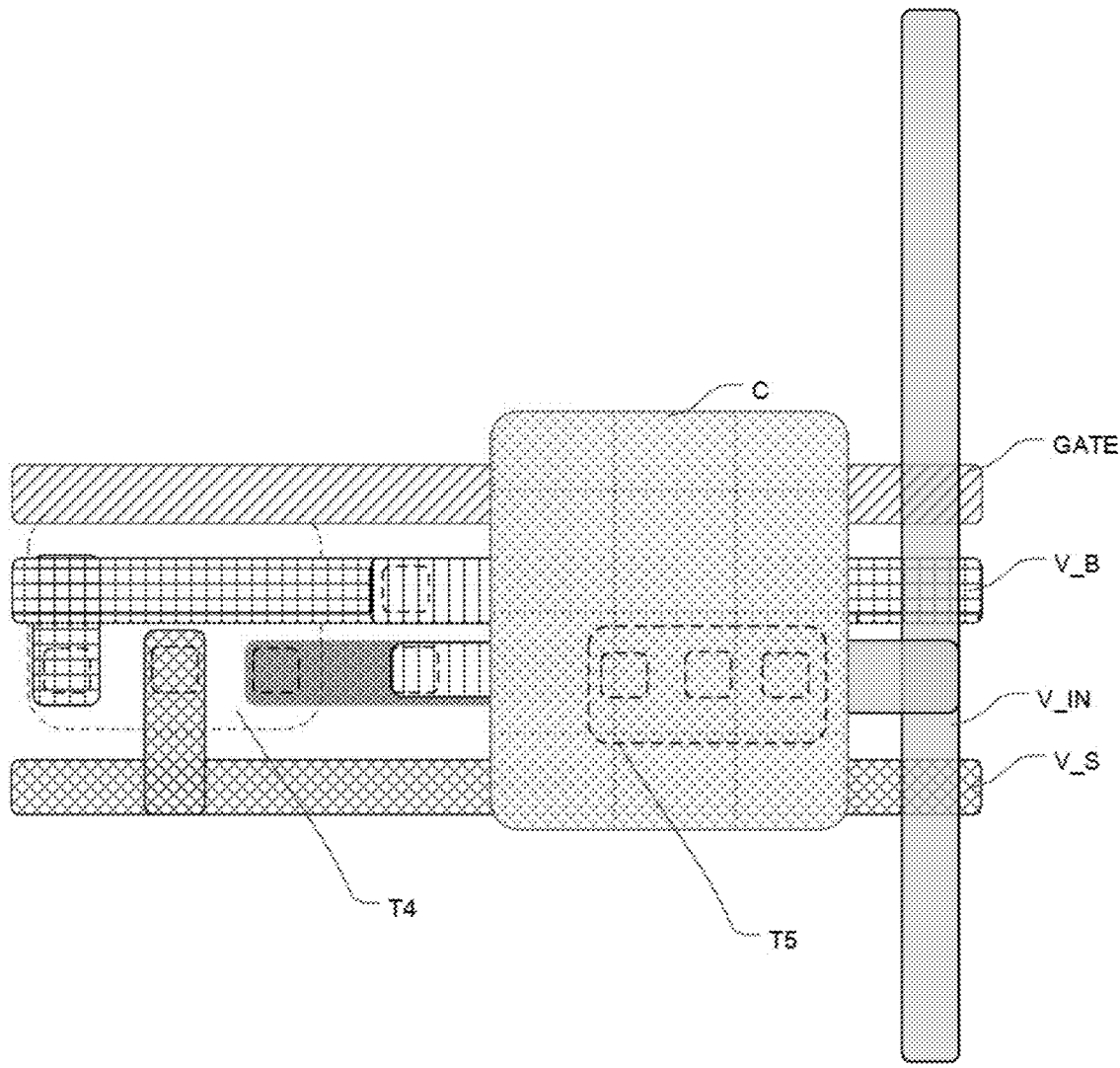
FIG. 8A is a top view of a photoelectric detection circuit according to an embodiment of the present disclosure.
Figure 8B:
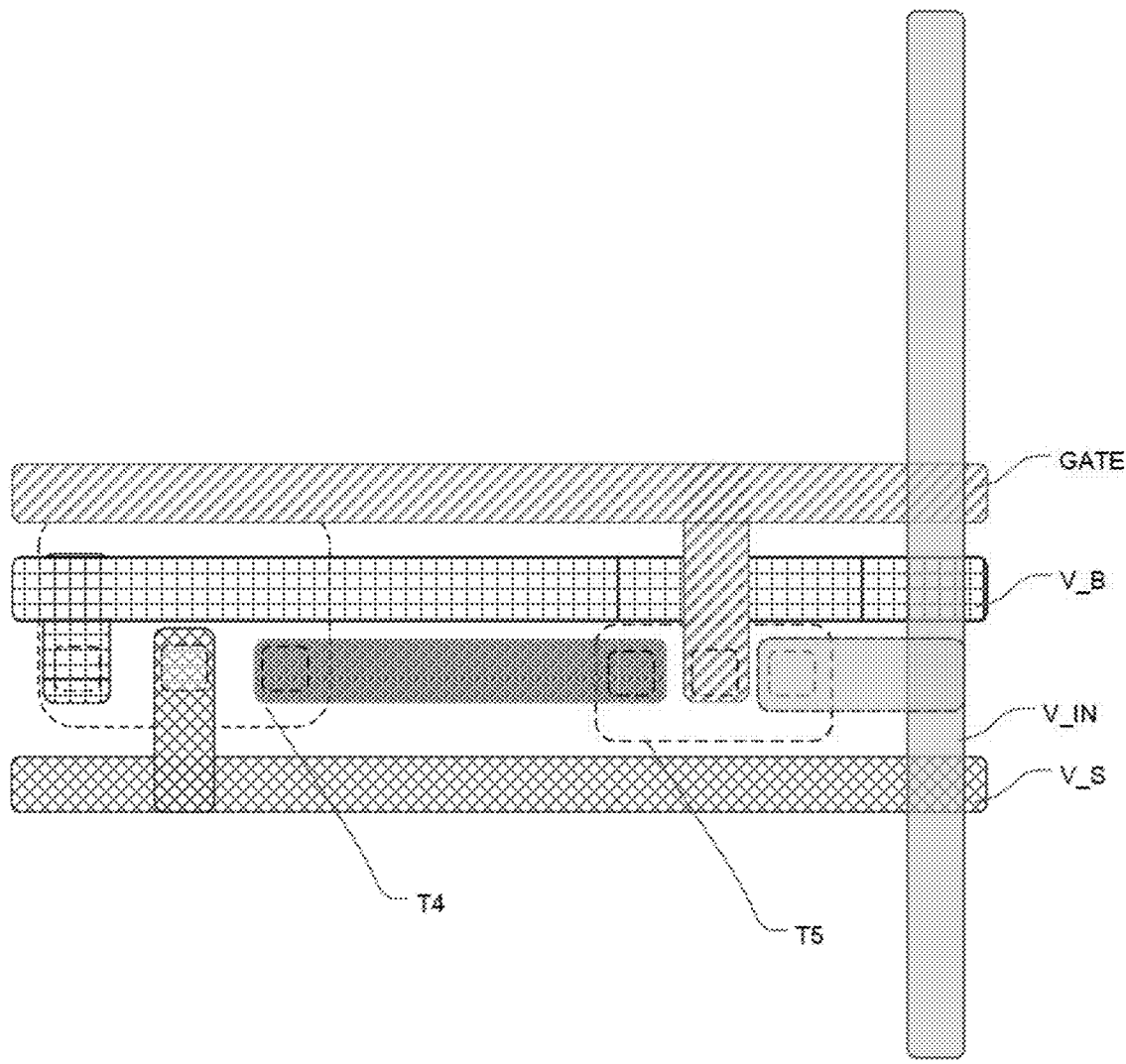
FIG. 8B is a top view of a photoelectric detection circuit according to an embodiment of the present disclosure.

FIG. 8A is a top view of a photoelectric detection circuit according to an embodiment of the present disclosure. For the convenience of description, only the fourth transistor T4, the fifth transistor T5 and the first capacitor C in the above-mentioned photoelectric detection circuit are shown. FIG. 8B is a top view of a photoelectric detection circuit according to an embodiment of the present disclosure, wherein the capacitor C is not shown in order to clearly show a structure of the fifth transistor T5.

As shown in FIG. 8A and FIG. 8B, the gate electrode 7101 of the fourth transistor T4 is connected to the detection voltage signal terminal V_S. The first electrode of the fourth transistor T4 is connected to the bias voltage signal terminal V_B. The second electrode of the fourth transistor T4 is connected to the first electrode of the fifth transistor T5. The gate electrode of the fifth transistor T5 is connected to the control signal terminal GATE. The first electrode of the fifth transistor T5 is connected to the second electrode of the fourth transistor T4. The second electrode of the fifth transistor T5 is connected to the first input terminal V_IN of the integrator sub-circuit through a signal line. The first electrode 7111 of the first capacitor C is connected to the bias voltage signal terminal V_S. The second electrode 7112 of the first capacitor C is connected to the input node PD.

Although the fourth transistor, the fifth transistor, and the first capacitor are shown in a specific layout in the above-mentioned embodiment, the embodiments of the present disclosure are not limited thereto. Any other suitable layout may be used to arrange each transistor in the detection circuit as required.

Figure 9:
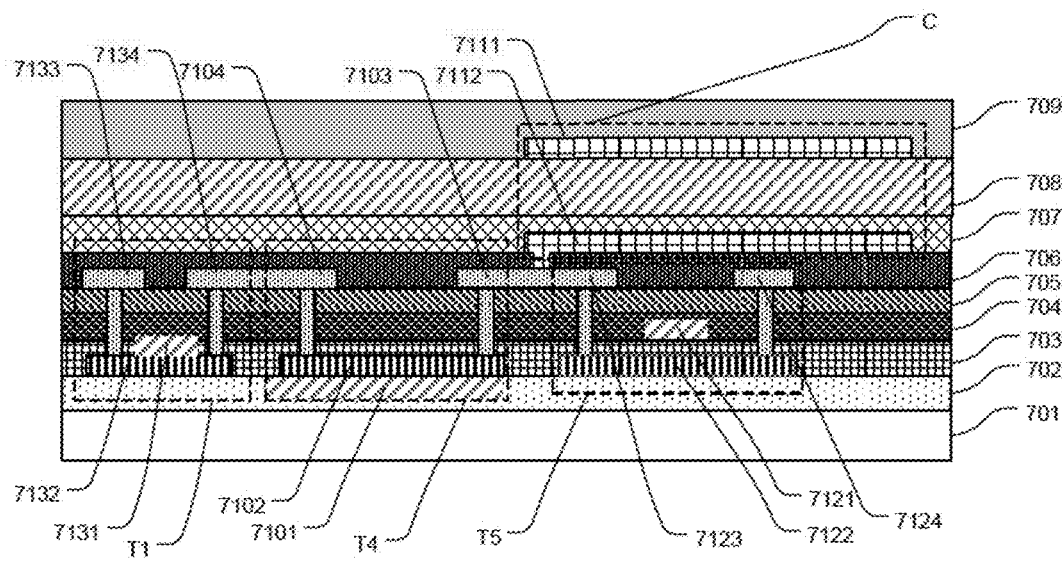
FIG. 9 is a cross-sectional view of a photoelectric detection circuit according to another embodiment of the present disclosure.

FIG. 9 is a cross-sectional view of a photoelectric detection circuit according to another embodiment of the present disclosure. The cross-sectional view of FIG. 9 may be applied to, for example, the above-described photoelectric detection circuit 300. As shown in FIG. 9, the photoelectric detection circuit may further include the reset auxiliary sub-circuit. The reset auxiliary sub-circuit may include a first transistor T1. For the convenience of description, only the fourth transistor T4, the fifth transistor T5 and the first transistor T1 are shown. The arrangement of each element in the photoelectric detection circuit of FIG. 9 is similar to that of FIG. 7. The difference is at least that the first transistor T1 is further included in FIG. 9. For the sake of brevity, the different part will be mainly described in detail below.

The first transistor T1 may be disposed on the base substrate 701. A first electrode 7033 and a second electrode 7134 of the first transistor T1 and the first electrode 7104 and the second electrode 7103 of the fourth transistor T4 may be disposed in the same layer as the first electrode 7123 and the second electrode 7124 of the fifth transistor T5. An active layer 7132 of the first transistor T1 and the active layer 7102 of the fourth transistor T4 are disposed in the same layer as the active layer 7122 of the fifth transistor T5. A gate electrode 7131 of the first transistor T1 is disposed on a side of the active layer 7132 of the first transistor T1 away from the base substrate 701. The second electrode 7134 of the first transistor T1 is electrically connected to the first electrode 7104 of the fourth transistor T4.

Figure 10:
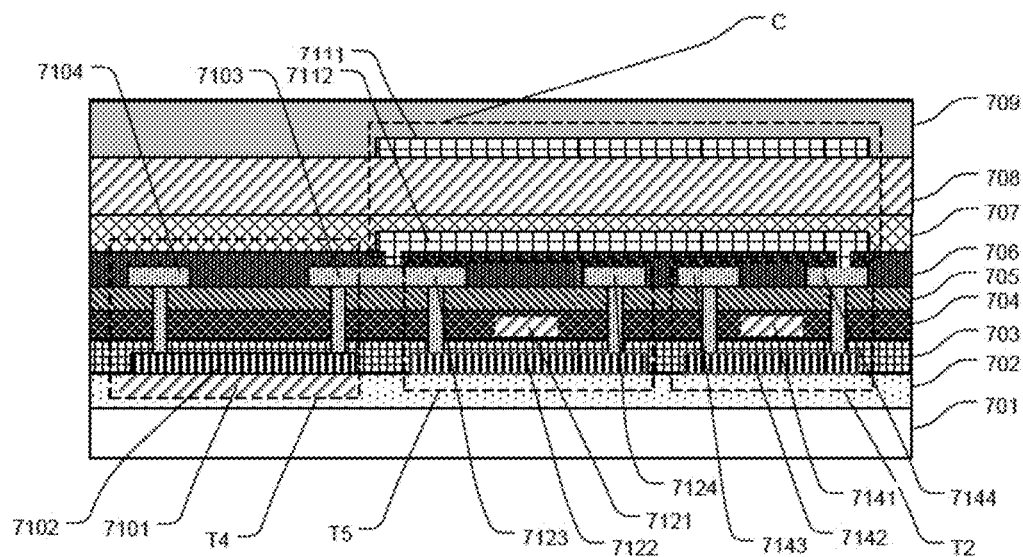
FIG. 10 is a cross-sectional view of a photoelectric detection circuit according to another embodiment of the present disclosure.

FIG. 10 is a cross-sectional view of a photoelectric detection circuit according to another embodiment of the present disclosure. The cross-sectional view is applicable to, for example, the above-described photoelectric detection circuit 400. As shown in FIG. 10, the detection circuit may further include the reset sub-circuit. The reset sub-circuit 460 may include the second transistor T2. The arrangement of each element in the photoelectric detection circuit of FIG. 10 is similar to that of FIG. 7. The difference is at least that the second transistor T2 is further included in FIG. 10. For the sake of brevity, the different part will be mainly described in detail below.

The second transistor T2 may be disposed on the base substrate 701. A first electrode 7143 and a second electrode 7144 of the second transistor T2 and the first electrode 7104 and the second electrode 7103 of the fourth transistor T4 may be disposed in the same layer as the first electrode 7123 and the second electrode 7124 of the fifth transistor T5. An active layer 7122 of the second transistor T2 and the active layer 7102 of the fourth transistor T4 are disposed in the same layer as the active layer 7122 of the fifth transistor T5. A gate electrode 7141 of the second transistor T2 is disposed on a side of the active layer 7142 of the second transistor T2 away from the base substrate 701.

In some embodiments, the second electrode 7144 of the second transistor T2 is electrically connected to the second electrode 7103 of the fourth transistor T4 and the first electrode 7123 of the fifth transistor T5. The second electrode 7112 of the first capacitor C is in contact with the second electrode 7144 of the second transistor T2 through a via hole in the first passivation layer 706.

Figure 11:
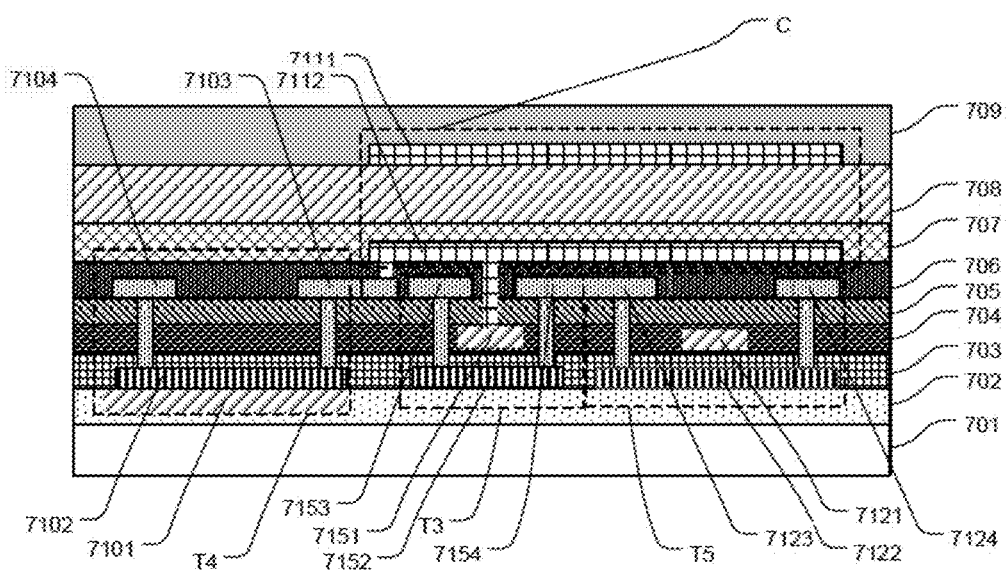
FIG. 11 is a cross-sectional view of a photoelectric detection circuit according to another embodiment of the present disclosure.

FIG. 11 is a cross-sectional view of a photoelectric detection circuit according to another embodiment of the present disclosure. Such cross-sectional view may be applied to, for example, the above-described photoelectric detection circuit 500. As shown in FIG. 11, the photoelectric detection circuit may further include the amplifying sub-circuit. The amplifying sub-circuit may include the third transistor T3. The arrangement of each element in the photoelectric detection circuit of FIG. 11 is similar to that of FIG. 7. The difference is at least that the third transistor T3 is further included in FIG. 11. For the sake of brevity, the different part will be mainly described in detail below:

The third transistor T3 may be disposed on the base substrate 701. A first electrode 7153 and a second electrode 7154 of the third transistor T3 and the first electrode 7104 and the second electrode 7103 of the fourth transistor T4 may be disposed in the same layer as the first electrode 7123 and the second electrode 7124 of the fifth transistor T5. An active layer 7152 of the third transistor T3 and the active layer 7102 of the fourth transistor T4 are disposed in the same layer as the active layer 7122 of the fifth transistor T5. A gate electrode 7151 of the third transistor T3 is disposed on a side of the active layer 7152 of the third transistor T3 away from the base substrate 701.

In some embodiments, the second electrode 7154 of the third transistor T3 is electrically connected to the first electrode 7123 of the fifth transistor T5. The second electrode 7112 of the first capacitor C is in contact with the gate electrode 7151 of the third transistor T3 through via holes in the first passivation layer 706, the interlayer dielectric layer 705 and the second gate insulating layer 704.

Figure 12:
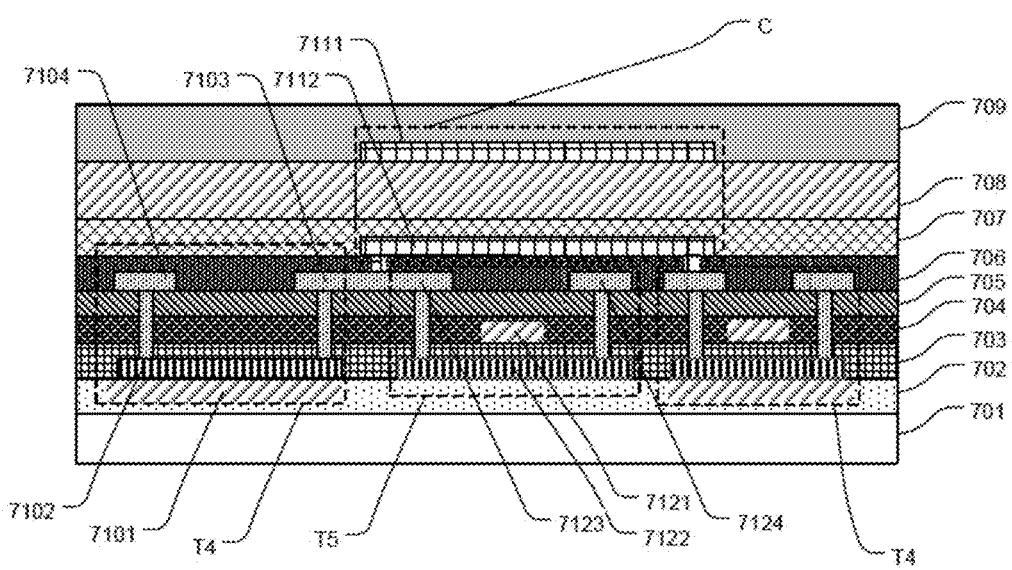
FIG. 12 is a cross-sectional view of a photoelectric detection circuit according to another embodiment of the present disclosure.

FIG. 12 is a cross-sectional view of a photoelectric detection circuit according to another embodiment of the present disclosure. The cross-sectional view is applicable to, for example, the above-described photoelectric detection circuit 600. As shown in FIG. 12, the photoelectric detection circuit may include a plurality of detection sub-circuits. Each detection sub-circuit may include a fourth transistor T4. The arrangement of each element in the photoelectric detection circuit of FIG. 12 is similar to that of FIG. 7. The difference is at least that the number of the fourth transistors T4 in FIG. 12 is greater than one. For the sake of brevity, the different part will be mainly described in detail below:

As shown in FIG. 12, two fourth transistors T4 have the same layer structure and circuit connection. The description of the fourth transistor T4 in the above embodiments is also applicable to this embodiment. The second electrode 7104 of each fourth transistor T4 is electrically connected to the first electrode 7123 of the fifth transistor T5 and the second electrode 7112 of the first capacitor C.

In some embodiments, the second electrode 7112 of the first capacitor C is respectively contacted with the second electrodes 7104 of the plurality of (two) fourth transistors T4 through a plurality of (two) via holes of the first passivation layer 706.

Figure 13:
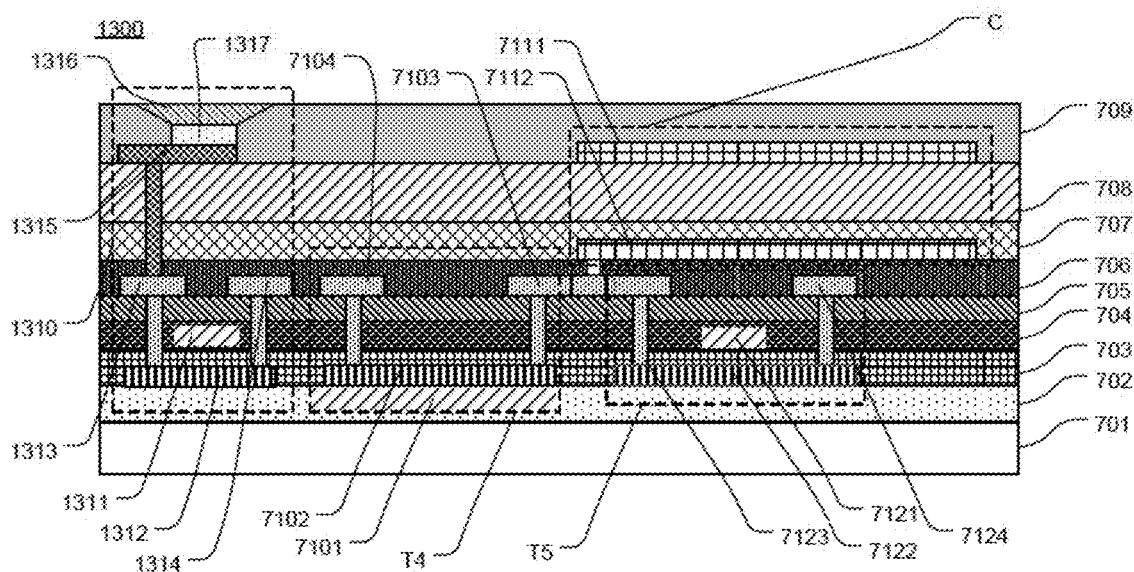
FIG. 13 is a cross-sectional view of a pixel unit according to an embodiment of the present disclosure.

FIG. 13 is a cross-sectional view of a pixel unit according to an embodiment of the present disclosure.

As shown in FIG. 13, a pixel unit 1300 includes at least one pixel circuit 1301 and the photoelectric detection circuit of any of the above embodiments. For the sake of brevity, only the fourth transistor T4, the fifth transistor T5 and the first capacitor C1 in the photoelectric detection circuit are shown.

The pixel circuit 1300 may include a driving transistor. The driving transistor may include a gate electrode 1311, a source electrode 1313 and a drain electrode 1314. The driving transistor may further include an active layer 1312 located on the base substrate 701. The gate electrode 1311 of the driving transistor is located on a side of the active layer 1312 away from the base substrate 701. The driving transistor may further include the first gate insulating layer 703 located between the active layer 1312 and the gate electrode 1311, the second gate insulating layer 704 located on a side of the gate electrode 1311 away from the base substrate 701, and the interlayer dielectric layer 705 located on a side of the second gate insulating layer 704 away from the base substrate 701. The source electrode 1313 and the drain electrode 1314 of the driving transistor are located on a side of the interlayer dielectric layer 705 away from the base substrate 701.

In some embodiments, the pixel circuit further includes a light-emitting unit. The light-emitting unit includes an anode 1315, a cathode 1316, and a light-emitting layer 1317 located between the anode 1315 and the cathode 1316. The planarization layer 708 is disposed on the side of the interlayer dielectric layer 705 away from the base substrate 701. The anode 1315 is located on a side of the planarization layer 708 away from the base substrate 701 and is connected to the source electrode 1313 or the drain electrode 1314 of the driving transistor by passing through the planarization layer 708.

The detection sub-circuit of the photoelectric detection circuit includes the fourth transistor T4. The control sub-circuit of the photoelectric detection circuit includes the fifth transistor T5. The gate electrode 7101 of the fourth transistor T4 is located between the first gate insulating layer 703 and the base substrate 701. The first electrode 7104 and the second electrode 7103 of the fourth transistor T4 are disposed in the same layer as at least one of the source electrode 1313 and the drain electrode 1314 of the driving circuit. The active layer 7102 of the fourth transistor T4 is disposed in the same layer as the active layer 1312 of the driving transistor. The gate electrode 7121 of the fifth transistor T5 is disposed in the same layer as the gate electrode 1311 of the driving transistor. The first electrode 7124 and the second electrode 7123 of the fifth transistor T5 are disposed in the same layer as at least one of the source electrode 1313 and the drain electrode 1314 of the driving transistor. The active layer 7122 of the fifth transistor T5 is disposed in the same layer as the active layer 1312 of the driving transistor.

The storage sub-circuit of the photoelectric detection circuit includes the first capacitor C. The first electrode 7111 of the first capacitor C is disposed in the same layer as the anode 1315 of the light-emitting unit. The second electrode 7112 of the first capacitor C is located on the side of the planarization layer 708 facing the base substrate 701.

In some embodiments, the first passivation layer 706 and the second passivation layer 707 are further disposed between the planarization layer 708 and the interlayer dielectric layer 705, with the second passivation layer 707 being located between the first passivation layer 706 and the planarization layer 708. The source electrode 1313 and the drain electrode 1314 of the driving transistor are located between the first passivation layer 706 and the interlayer dielectric layer 705. The second electrode 7112 of the first capacitor C is located between the second passivation layer 707 and the first passivation layer 706.

In some embodiments, the encapsulation layer 709 is disposed on the side of the planarization layer 708 away from the base substrate 701. The light-emitting unit and the first electrode 7111 of the first capacitor may be disposed between the encapsulation layer 709 and the planarization layer 708.

Figure 14:
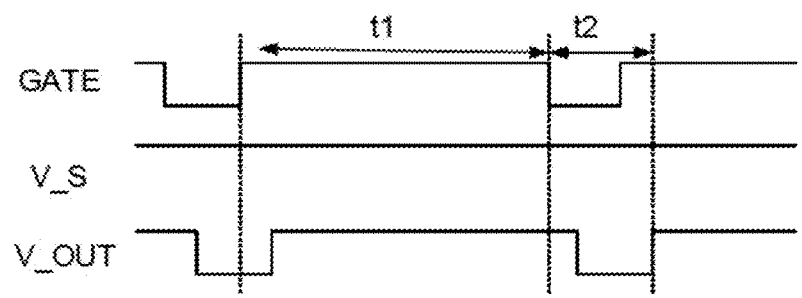
FIG. 14 is an operation timing diagram of a photoelectric detection circuit according to an embodiment of the present disclosure.

FIG. 14 is an operation timing diagram of a photoelectric detection circuit according to an embodiment of the present disclosure. The operation timing of FIG. 14 will be described below in conjunction with the above-mentioned photoelectric detection circuit 200. As shown in FIG. 14, a periodic signal is applied to the control signal terminal GATE. A constant voltage e.g. between −3V and −6V is applied to the detection voltage signal terminal V_S. A constant voltage e.g. between −4V and −10V is applied to the bias voltage signal terminal V_B.

During a period t1, the control signal terminal GATE is at a high level, so that the fifth transistor T5 is turned off, thereby electrically isolating the input node PD from the first input terminal V_IN. The potentials of the detection voltage signal terminal V_S and the bias voltage signal terminal V_B make the fourth transistor T4 in a reverse conduction state, so that the fourth transistor T4 may generate the current flowing between the bias voltage signal terminal V_B and the input node PD in response to the optical signal. The first capacitor C stores the charges generated by the fourth transistor T4.

During a period t2, the control signal terminal GATE is at the low level, so that the fifth transistor T5 is turned on, thereby electrically connecting the input node PD to the first input terminal V_IN. The fifth transistor T5 provides the potential of the input node PD to the first input terminal V_IN, so that the charges stored in the first capacitor C is derived to the capacitor in the back-end integrator sub-circuit. The operational amplifier AMP in the integrator sub-circuit generates the integrated signal based on a reference level of the second input terminal V_R and a signal at the first input terminal V_IN, and output the integrated signal at the output terminal V_OUT.

Figure 15:
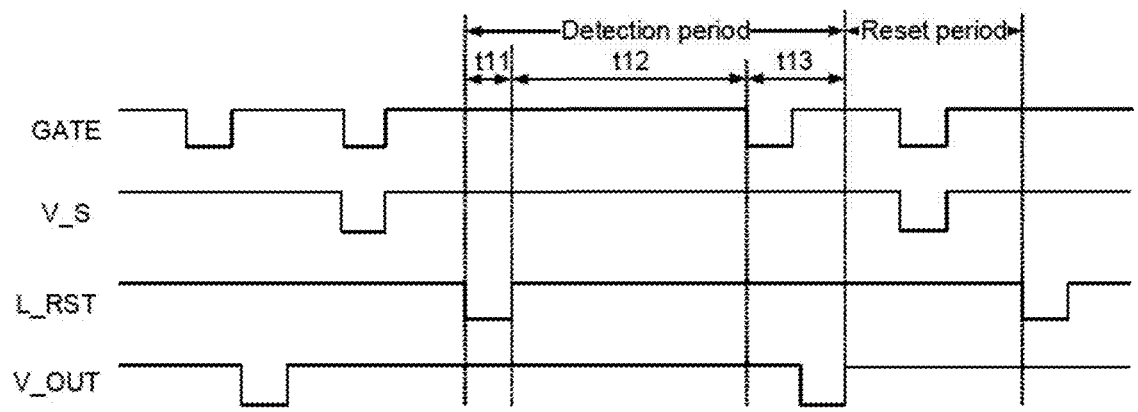
FIG. 15 is an operation timing diagram of a photoelectric detection circuit according to another embodiment of the present disclosure.

FIG. 15 is an operation timing diagram of a photoelectric detection circuit according to another embodiment of the present disclosure. The operation timing of FIG. 15 will be described below in conjunction with the above-mentioned photoelectric detection circuit 300. As shown in FIG. 15, each detection cycle includes a detection period and a reset period, wherein the detection period includes periods t11, t12 and t13.

During the period t11, the reset auxiliary signal terminal L_RST is at the low level, the detection voltage signal terminal V_S is at the high level, and the control signal terminal GATE is at the high level. The low level at the reset auxiliary signal terminal L_RST cause the first transistor T1 to be turned on, such that the bias voltage of the bias voltage signal terminal V_B is provided to the fourth transistor T4. The potentials of the detection voltage signal terminal V_S and the bias voltage signal terminal V_B make the fourth transistor T4 in the reverse conduction state, so that the fourth transistor T4 generates charges in response to the optical signal in order to generate the current flowing between the bias voltage signal terminal V_B and the input node PD. The first capacitor C stores the charges generated by the fourth transistor T4. The control signal terminal GATE is at the high level, so that the fifth transistor T5 is turned off, thereby electrically isolating the input node PD from the integrator sub-circuit 330.

During the period t12, the reset auxiliary signal terminal L_RST is at the high level, so that the first transistor T1 is turned off. The first electrode of the fourth transistor T4 is kept at the bias voltage due to the first capacitor C. During this process, the potentials of the detection voltage signal terminal V_S and the bias voltage signal terminal V_B remain unchanged, so that the fourth transistor T4 continues to generate charges in response to the optical signal and store the charges in the first capacitor C.

During the period t13, the control signal terminal GATE is at the low level, so that the fifth transistor T5 is turned on and the input node PD is electrically connected to the first input terminal V_IN, thereby providing the potential of the input node PD to the first input terminal V_IN. The charges stored in the first capacitor C is derived to the back-end integrator sub-circuit, so that the output terminal V_OUT generates the output signal.

During the reset period, the reset auxiliary signal terminal L_RST is at the high level, the detection voltage signal terminal V_S is at the low level, and the control signal terminal GATE is at the low level. The reset auxiliary signal terminal L_RST is at the high level, so that the first transistor T1 is turned off, thereby electrically isolating the fourth transistor T4 and the fifth transistor T5 from the bias voltage signal terminal V_B. The detection voltage signal terminal V_S and the control signal terminal GATE are at the low level, so that the fourth transistor T4 and the fifth transistor T5 are respectively turned on, thereby resetting the potential of the input node PD to the voltage of the second input terminal V_R.

Figure 16:
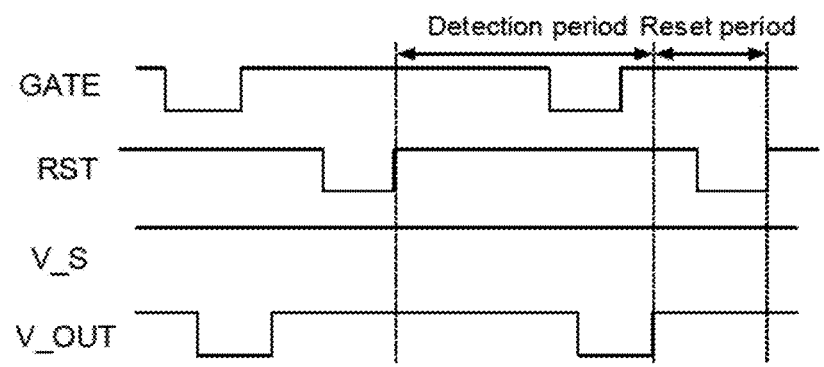
FIG. 16 is an operation timing diagram of a photoelectric detection circuit according to another embodiment of the present disclosure.

FIG. 16 is an operation timing diagram of a photoelectric detection circuit according to another embodiment of the present disclosure. The operation timing of FIG. 16 will be described below in conjunction with the above-mentioned photoelectric detection circuit 400.

During the detection period, the reset signal terminal RST is at the high level, so that the fifth transistor T5 is turned off, thereby electrically isolating the input node PD from the first input terminal V_IN. The potentials of the detection voltage signal terminal V_S and the bias voltage signal terminal V_B cause the fourth transistor T4 to generate the current flowing between the bias voltage signal terminal V_B and the input node PD in response to the optical signal. The first capacitor C stores the charges generated by the fourth transistor T4. When the low level of the control signal terminal GATE arrives, the fifth transistor T5 is turned on, thereby electrically connecting the input node PD to the first input terminal V_IN and providing the potential of the input node PD to the first input terminal V_IN. The charges stored in the first capacitor C are derived to the capacitor in the back-end integrator sub-circuit, so that the output terminal V_OUT generates an output signal of low level.

During the reset period, the reset signal terminal RST is at the low level, and the control signal terminal GATE is at the high level. The reset signal terminal RST is at the low level, so that the second transistor T2 is turned on and the reset voltage terminal V_RST is electrically connected to the input node PD, so as to provide the potential of the reset voltage terminal V_RST to the input node PD to achieve the reset of the input node PD.

Figure 17:
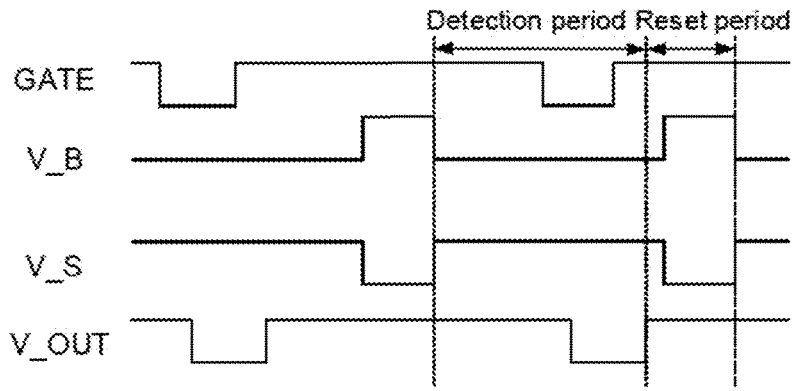
FIG. 17 is an operation timing diagram of a photoelectric detection circuit according to another embodiment of the present disclosure.

FIG. 17 is an operation timing diagram of a photoelectric detection circuit according to another embodiment of the present disclosure. The operation timing of FIG. 17 will be described below in conjunction with the above-mentioned photoelectric detection circuit 500.

During the detection period, the potentials of the bias voltage signal terminal V_B and the detection voltage signal terminal V_S cause the fourth transistor T4 to generate the current flowing between the bias voltage signal terminal V_B and the input node PD in response to the optical signal. The first capacitor C stores the charges generated by the fourth transistor T4. When the low level of the control signal terminal GATE arrives, the fifth transistor T5 is turned on, thereby electrically connecting the input node PD to the first input terminal V_IN and providing the potential of the input node PD to the first input terminal V_IN. The charges stored in the first capacitor C are derived to the capacitor in the back-end integrator sub-circuit, so that the output terminal V_OUT generates the output signal.

During the reset period, the detection voltage signal terminal V_S is at the low level. The potential of the bias voltage signal terminal V_B may be changed from the potential of the detection period (e.g. −4V) to the reference voltage, e.g., may be equal to a reference voltage at the second input terminal V_R of the integrator sub-circuit, which is 1.4V. The potentials of the bias voltage signal terminal V_B and the detection voltage signal terminal V_S make the fourth transistor T4 conduct forward, thereby providing the reference voltage of the bias voltage signal terminal V_B to the input node PD to complete the reset of the input node PD.

In some embodiments, the operation timing of the photoelectric detection circuit 600 is similar to the operation timing of the photoelectric detection circuit 200, and reference may be made to the operation timing of FIG. 14 described above, which will not be repeated here.

Figure 18:
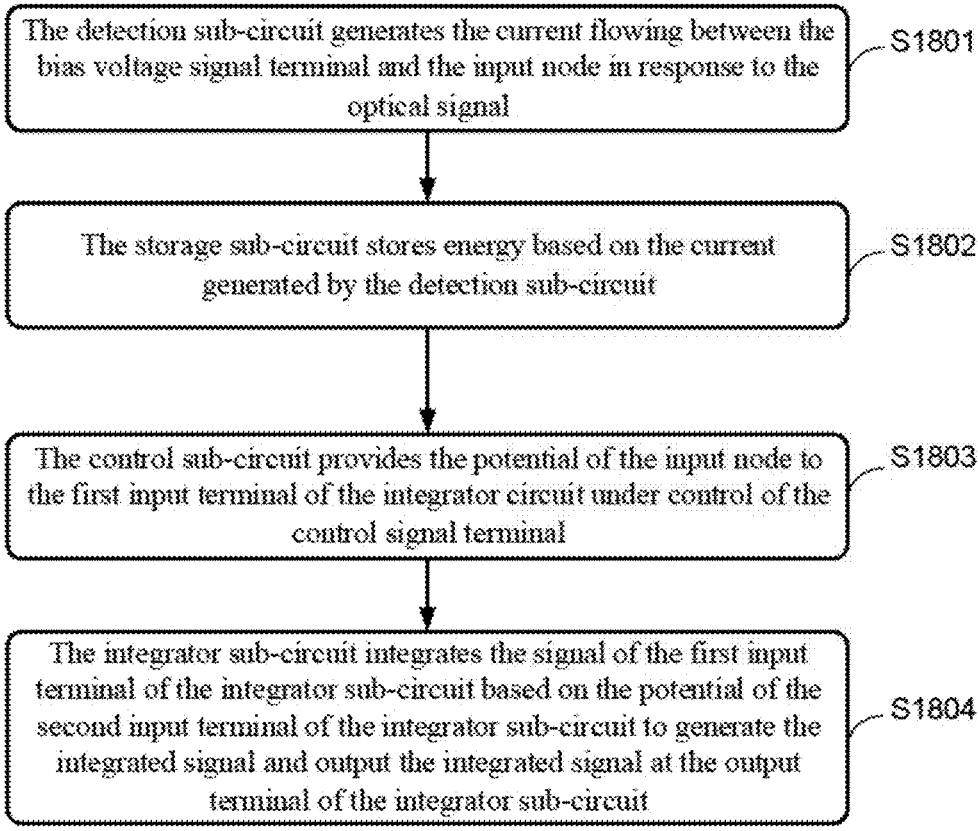
FIG. 18 is a flowchart of a method of controlling a photoelectric detection circuit according to an embodiment of the present disclosure.

FIG. 18 is a flowchart of a method of controlling a photoelectric detection circuit according to an embodiment of the present disclosure.

A control method 1800 may include operations S1801 to S1804.

In operation S1801, the detection sub-circuit generates the current flowing between the bias voltage signal terminal and the input node in response to the optical signal.

In operation S1802, the storage sub-circuit stores energy based on the current generated by the detection sub-circuit.

In operation S1803, the control sub-circuit provides the potential of the input node to the first input terminal of the integrator sub-circuit under control of the control signal terminal.

In operation S1804, the integrator sub-circuit integrates the signal of the first input terminal of the integrator sub-circuit based on the potential of the second input terminal of the integrator sub-circuit to generate the integrated signal and output the integrated signal at the output terminal of the integrator sub-circuit.

In some embodiments, the photoelectric detection circuit further includes the reset auxiliary sub-circuit. The method includes the detection period and the reset period.

During the detection period, the reset auxiliary sub-circuit electrically connects the detection sub-circuit to the bias voltage signal terminal under control of a reset auxiliary signal terminal. The detection sub-circuit generates the current flowing between the bias voltage signal terminal and the input node in response to the optical signal. The storage sub-circuit stores energy based on the current generated by the detection sub-circuit. The control sub-circuit provides the potential of the input node to the first input terminal of the integrator sub-circuit under control of the control signal terminal. The integrator sub-circuit integrates the signal of the first input terminal based on the potential of the second input terminal to generate the integrated signal and output the integrated signal at the output terminal of the integrator sub-circuit.

During the reset period, the reset auxiliary sub-circuit electrically isolates the detection sub-circuit from the bias voltage signal terminal under control of the reset auxiliary signal terminal. The detection sub-circuit electrically connects the bias voltage signal terminal to the input node under control of the potential of the detection voltage signal terminal. The control sub-circuit electrically connects the input node to the first input terminal of the integrator sub-circuit under control of the control signal terminal.

In some embodiments, the photoelectric detection circuit further includes the reset sub-circuit. The method includes the detection period and the reset period.

During the detection period, the reset sub-circuit electrically isolates the reset voltage terminal from the input node under control of a reset signal terminal. The detection sub-circuit generates the current flowing between the bias voltage signal terminal and the input node in response to the optical signal. The storage sub-circuit stores energy based on the current generated by the detection sub-circuit. The control sub-circuit provides the potential of the input node to the first input terminal of the integrator sub-circuit under control of the control signal terminal. The integrator sub-circuit integrates the signal of the first input terminal of the integrator sub-circuit based on the potential of the second input terminal to generate the integrated signal and output the integrated signal at the output terminal of the integrator sub-circuit.

During the reset period, the reset sub-circuit electrically connects the reset voltage terminal and the input node under control of the reset signal terminal. The control sub-circuit electrically isolates the input node from the first input terminal of the integrator sub-circuit under control of the control signal terminal.

In some embodiments, the photoelectric detection circuit further includes the amplifying sub-circuit. The method includes the detection period and the reset period.

During the detection period, the detection sub-circuit generates the current flowing between the bias voltage signal terminal and the input node in response to the optical signal under control of the potential of the detection voltage signal terminal. The storage sub-circuit stores energy based on the current generated by the detection sub-circuit. The amplifying sub-circuit generates a current flowing between the reference voltage terminal and the control sub-circuit under control of the potential of the input node. The control sub-circuit provides the current generated by the amplifying sub-circuit to the first input terminal of the integrator sub-circuit under control of the control signal terminal. The integrator sub-circuit integrates the signal of the first input terminal based on the potential of the second input terminal of the integrator sub-circuit to generate the integrated signal and output the integrated signal at the output terminal of the integrator sub-circuit.

During the reset period, the detection sub-circuit electrically connects the bias voltage signal terminal to the input node under control of the potential of the detection voltage signal terminal. A potential of the bias voltage signal terminal during the reset period is different from a potential of the bias voltage signal terminal during the detection period.

It should be noted that, in the above description, the technical solutions of the embodiments of the present disclosure are shown only by way of example, but it does not mean that the embodiments of the present disclosure are limited to the above steps and structures. Where possible, steps and structures may be adjusted and selected as required. Therefore, some steps and units are not necessary elements for implementing the general inventive concept of the embodiments of the present disclosure.

The present disclosure has thus far been described in connection with the preferred embodiments. It should be understood that various other changes, substitutions and additions may be made by those skilled in the art without departing from the spirit and scope of the embodiments of the present disclosure. Accordingly, the scope of embodiments of the present disclosure should not be limited to the specific embodiments described above, but should be defined by the appended claims.

What is claimed is:

1. A photoelectric detection circuit, comprising:
   a detection sub-circuit connected to a detection voltage signal terminal, a bias voltage signal terminal and an input node, and configured to generate a current flowing between the bias voltage signal terminal and the input node in response to an optical signal under control of a potential of the detection voltage signal terminal;
   a storage sub-circuit connected between the bias voltage signal terminal and the input node, and configured to store energy based on the current generated by the detection sub-circuit;
   an integrator sub-circuit having a first input terminal, a second input terminal and an output terminal, and configured to integrate a signal of the first input terminal based on a potential of the second input terminal to generate an integrated signal and output the integrated signal at the output terminal; and
   control sub-circuit connected to a control signal terminal, the input node and the first input terminal of the integrator sub-circuit, and configured to provide a potential of the input node to the first input terminal of the integrator sub-circuit under control of the control signal terminal.

2. The photoelectric detection circuit according to claim 1, wherein the storage sub-circuit comprises a first capacitor, wherein a first electrode of the first capacitor is connected to the bias voltage signal terminal, and a second electrode of the first capacitor is connected to the input node.

3. The photoelectric detection circuit according to claim 1, further comprising a reset auxiliary sub-circuit, wherein the detection sub-circuit is connected to the bias voltage signal terminal through the reset auxiliary sub-circuit, and the reset auxiliary sub-circuit is configured to, under control of a reset auxiliary signal terminal, electrically connect the detection sub-circuit to the bias voltage signal terminal during a detection period and electrically isolate the detection sub-circuit from the bias voltage signal terminal during a reset period.

4. The photoelectric detection circuit according to claim 3, wherein the reset auxiliary sub-circuit comprises a first transistor, wherein a gate electrode of the first transistor is connected to the reset auxiliary signal terminal, a first electrode of the first transistor is connected to the bias voltage signal terminal, and a second electrode of the first transistor is connected to the detection sub-circuit.

5. The photoelectric detection circuit according to claim 1, further comprising a reset sub-circuit connected to a reset signal terminal, the input node and a reset voltage terminal, and configured to provide a potential of the reset voltage terminal to the input node under control of a signal of the reset signal terminal, wherein the potential of the reset voltage terminal is equal to the potential of the second input terminal of the integrator sub-circuit.

6. The photoelectric detection circuit according to claim 5, wherein the reset sub-circuit comprises a second transistor, wherein a gate electrode of the second transistor is connected to the reset signal terminal, a first electrode of the second transistor is connected to the reset voltage terminal, and a second electrode of the second transistor is connected to the input node.

7. The photoelectric detection circuit according to claim 1, further comprising an amplifying sub-circuit connected between the input node and the control sub-circuit and connected to a reference voltage terminal, wherein the amplifying sub-circuit is configured to generate a current flowing between the reference voltage terminal and the control sub-circuit under control of the potential of the input node.

8. The photoelectric detection circuit according to claim 7, wherein the amplifying sub-circuit comprises a third transistor, a gate electrode of the third transistor is connected to the input node, a first electrode of the third transistor is connected to the reference voltage terminal, and a second electrode of the third transistor is connected to the control sub-circuit.

9. The photoelectric detection circuit according to claim 1, wherein the detection sub-circuit comprises a fourth transistor, wherein a gate electrode of the fourth transistor is connected to the detection voltage signal terminal, a first electrode of the fourth transistor is connected to the bias voltage signal terminal, and a second electrode of the fourth transistor is connected to the input node.

10. The photoelectric detection circuit according to claim 1, wherein the photoelectric detection circuit comprises a plurality of detection sub-circuits.

11. The photoelectric detection circuit according to claim 1, wherein the control sub-circuit comprises a fifth transistor, wherein a gate electrode of the fifth transistor is connected to the control signal terminal, a first electrode of the fifth transistor is connected to the input node, and a second electrode of the fifth transistor is connected to the first input terminal of the integrator sub-circuit.

12. The photoelectric detection circuit according to claim 1, wherein the integrator sub-circuit comprises:
   an operational amplifier, wherein a first input terminal of the operational amplifier is connected as the first input terminal of the integrator sub-circuit, a second input terminal of the operational amplifier is connected as the second input terminal of the integrator sub-circuit, and an output terminal of the operational amplifier is connected as the output terminal of the integrator sub-circuit; and
   a second capacitor, wherein a first electrode of the second capacitor is connected to the first input terminal of the operational amplifier, and a second electrode of the second capacitor is connected to the second input terminal of the operational amplifier,
   wherein the detection sub-circuit comprises a fourth transistor, the control sub-circuit comprises a fifth transistor, the fourth transistor and the fifth transistor are disposed on a base substrate, a first electrode of the fourth transistor and a second electrode of the fourth transistor are disposed in the same layer as a first electrode of the fifth transistor and a second electrode of the fifth transistor, an active layer of the fourth transistor is disposed in the same layer as an active layer of the fifth transistor, a gate electrode of the fourth transistor is disposed on a side of the active layer of the fourth transistor facing the base substrate, and a gate electrode of the fifth transistor is disposed on a side of the active layer of the fifth transistor away from the base substrate;

wherein a planarization layer is disposed on a side of the fourth transistor and the fifth transistor away from the base substrate, a first electrode of the first capacitor is located on a side of the planarization layer away from the base substrate, and a second electrode of the first capacitor is located on a side of the planarization layer facing the base substrate.

13. A pixel unit, comprising:

at least one pixel circuit, wherein each pixel circuit is configured to emit light based on a data voltage; and the photoelectric detection circuit according to claim 1.

14. The pixel unit according to claim 13, wherein:

the pixel circuit comprises a driving transistor, the driving transistor comprises an active layer located on a base substrate, a gate electrode located on a side of the active layer away from the base substrate, a first gate insulating layer located between the active layer and the gate electrode, a second gate insulating layer located on a side of the gate electrode away from the base substrate, an interlayer dielectric layer located on a side of the second gate insulating layer away from the base substrate, and a source electrode and a drain electrode located on a side of the interlayer dielectric layer away from the base substrate; and the detection sub-circuit of the photoelectric detection circuit comprises a fourth transistor, and the control sub-circuit of the photoelectric detection circuit comprises a fifth transistor, wherein a gate electrode of the fourth transistor is located between the first gate insulating layer and the base substrate, a first electrode of the fourth transistor and a second electrode of the fourth transistor are disposed in the same layer as at least one of the source electrode of the driving transistor and the drain electrode of the driving transistor, an active layer of the fourth transistor is disposed in the same layer as the active layer of the driving transistor, a gate electrode of the fifth transistor is located in the same layer as the gate electrode of the driving transistor, a first electrode of the fifth transistor and a second electrode of the fifth transistor are disposed in the same layer as at least one of the source electrode of the driving transistor and the drain electrode of the driving transistor, and an active layer of the fifth transistor is disposed in the same layer as the active layer of the driving transistor.

15. The pixel unit according to claim 14, wherein:

the pixel circuit further comprises a light-emitting unit having an anode, a cathode, and a light-emitting layer located between the anode and the cathode, wherein a planarization layer is disposed on a side of the interlayer dielectric layer away from the base substrate, and the anode is located on a side of the planarization layer away from the base substrate and is connected to the source electrode of the driving transistor or the drain electrode of the driving transistor by passing through the planarization layer; and the storage sub-circuit of the photoelectric detection circuit comprises a first capacitor, a first electrode of the first capacitor is disposed in the same layer as the anode, and a second electrode of the first capacitor is located on a side of the planarization layer facing the base substrate.

16. The pixel unit according to claim 15, wherein:

a first passivation layer and a second passivation layer are further disposed between the planarization layer and the interlayer dielectric layer, wherein the second passivation layer is located between the first passivation layer and the planarization layer, the source electrode of the driving transistor and the drain electrode of the driving transistor are located between the first passivation layer and the interlayer dielectric layer, and the second electrode of the first capacitor is located between the second passivation layer and the first passivation layer.

17. A method of controlling the photoelectric detection circuit according to claim 1, comprising:

generating, by the detection sub-circuit, the current flowing between the bias voltage signal terminal and the input node in response to the optical signal;

storing, by the storage sub-circuit, energy based on the current generated by the detection sub-circuit;

providing, by the control sub-circuit, the potential of the input node to the first input terminal of the integrator sub-circuit under control of the control signal terminal; and integrating, by the integrator sub-circuit, the signal of the first input terminal of the integrator sub-circuit based on the potential of the second input terminal of the integrator sub-circuit to generate the integrated signal and output the integrated signal at the output terminal of the integrator sub-circuit.

18. The method according to claim 17, wherein the photoelectric detection circuit further comprises a reset auxiliary sub-circuit, and the method comprises:

during a detection period, electrically connecting, by the reset auxiliary sub-circuit, the detection sub-circuit to the bias voltage signal terminal under control of a reset auxiliary signal terminal, generating, by the detection sub-circuit, the current flowing between the bias voltage signal terminal and the input node in response to the optical signal, storing, by the storage sub-circuit, energy based on the current generated by the detection sub-circuit, providing, by the control sub-circuit, the potential of the input node to the first input terminal of the integrator sub-circuit under control of the control signal terminal, and integrating, by the integrator sub-circuit, the signal of the first input terminal based on the potential of the second input terminal to generate the integrated signal and output the integrated signal at the output terminal of the integrator sub-circuit; and during a reset period, electrically isolating, by the reset auxiliary sub-circuit, the detection sub-circuit from the bias voltage signal terminal under control of the reset auxiliary signal terminal, electrically connecting, by the detection sub-circuit, the bias voltage signal terminal to the input node under control of the potential of the detection voltage signal terminal, and electrically connecting, by the control sub-circuit, the input node to the first input terminal of the integrator sub-circuit under control of the control signal terminal.

19. The method according to claim 17, wherein the photoelectric detection circuit further comprises a reset sub-circuit, and the method comprises:

during a detection period, electrically isolating, by the reset sub-circuit, the reset voltage terminal from the input node under control of a reset signal terminal, generating, by the detection sub-circuit, the current flowing between the bias voltage signal terminal and the input node in response to the optical signal, storing, by the storage sub-circuit, energy based on the current generated by the detection sub-circuit, providing, by the control sub-circuit, the potential of the input node to the first input terminal of the integrator sub-circuit under control of the control signal terminal, and integrating, by the integrator sub-circuit, the signal of the first input terminal of the integrator sub-circuit based on the potential of the second input terminal to generate the integrated signal and output the integrated signal at the output terminal of the integrator sub-circuit; and during a reset period, electrically connecting, by the reset sub-circuit, the reset voltage terminal and the input node under control of the reset signal terminal, and electrically isolating, by the control sub-circuit, the input node from the first input terminal of the integrator sub-circuit under control of the control signal terminal.

20. The method according to claim 17, wherein the photoelectric detection circuit further comprises an amplifying sub-circuit, and the method comprises:

during a detection period, generating, by the detection sub-circuit, the current flowing between the bias voltage signal terminal and the input node in response to the optical signal under control of the potential of the detection voltage signal terminal, storing, by the storage sub-circuit, energy based on the current generated by the detection sub-circuit, generating, by the amplifying sub-circuit, a current flowing between the reference voltage terminal and the control sub-circuit under control of the potential of the input node, providing, by the control sub-circuit, the current generated by the amplifying sub-circuit to the first input terminal of the integrator sub-circuit under control of the control signal terminal, and integrating, by the integrator sub-circuit, the signal of the first input terminal based on the potential of the second input terminal of the integrator sub-circuit to generate the integrated signal and output the integrated signal at the output terminal of the integrator sub-circuit; and during a reset period, electrically connecting, by the detection sub-circuit, the bias voltage signal terminal to the input node under control of the potential of the detection voltage signal terminal, wherein a potential of the bias voltage signal terminal during the reset period is different from a potential of the bias voltage signal terminal during the detection period.

* * * * *